US009142594B2

(12) United States Patent
Imai et al.

(10) Patent No.: US 9,142,594 B2
(45) Date of Patent: Sep. 22, 2015

(54) IMAGING DEVICE AND METHOD FOR MANUFACTURING IMAGING DEVICE

(71) Applicant: FUJIFILM Corporation, Tokyo (JP)

(72) Inventors: Shinji Imai, Kanagawa (JP); Toshihiro Nakatani, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/263,287

(22) Filed: Apr. 28, 2014

(65) Prior Publication Data

US 2014/0231782 A1    Aug. 21, 2014

Related U.S. Application Data

(63) Continuation of application No. PCT/JP2012/077977, filed on Oct. 30, 2012.

(30) Foreign Application Priority Data

Oct. 31, 2011    (JP) ................................. 2011-238985
Oct. 29, 2012    (JP) ................................. 2012-238281

(51) Int. Cl.
    *H01L 27/30*       (2006.01)
    *H01L 51/44*       (2006.01)
    *H01L 51/42*       (2006.01)

(52) U.S. Cl.
    CPC ............ *H01L 27/307* (2013.01); *H01L 51/448* (2013.01); *H01L 51/428* (2013.01); *Y02E 10/549* (2013.01)

(58) Field of Classification Search
    CPC ..... H01L 27/307; H01L 5/488; H01L 51/428; Y02E 10/549
See application file for complete search history.

(56) References Cited

U.S. PATENT DOCUMENTS

2006/0196533 A1    9/2006   Maehara
2011/0049591 A1    3/2011   Nakatani et al.
(Continued)

FOREIGN PATENT DOCUMENTS

JP        4213832 B2    10/2000
JP        2004-165512 A    6/2004
JP        2006-245045 A    9/2006
(Continued)

OTHER PUBLICATIONS

An Office Action; "Notification of Reasons for Refusal," issued by the Japanese Patent Office on Aug. 5, 2014, which corresponds to Japanese Patent Application No. 2012-238281 and is related to U.S. Appl. No. 14/263,287; with English language partial translation.
(Continued)

*Primary Examiner* — William Coleman
(74) *Attorney, Agent, or Firm* — Studebaker & Brackett PC

(57) ABSTRACT

An imaging device includes a substrate, lower electrodes formed on the substrate, an organic layer formed on the lower electrodes and generating electric charges in response to irradiation with light, an upper electrode formed on the organic layer and transmitting the light, a protective film formed on the upper electrode, and a patterned organic film formed on the protective film. The protective film is composed of at least one layer and has a total thickness of 30 to 500 nm. The protective film of a single layer type has an internal stress of −50 MPa to +60 MPa in the whole of the protective film.

18 Claims, 9 Drawing Sheets

(56) References Cited

U.S. PATENT DOCUMENTS

| | | |
|---|---|---|
| 2011/0049661 A1 | 3/2011 | Maehara et al. |
| 2011/0057280 A1 | 3/2011 | Kawamura et al. |

FOREIGN PATENT DOCUMENTS

| | | |
|---|---|---|
| JP | 2008-258421 A | 10/2008 |
| JP | 2010-054923 A | 3/2010 |
| JP | 2011-071483 A | 4/2011 |
| WO | 2011/125527 A1 | 10/2011 |

OTHER PUBLICATIONS

International Search Report; PCT/JP2012/077977; Dec. 11, 2012.
Notification of Transmittal of Translation of the International Preliminary Report on Patentability and Translation of Written Opinion of the International Searching Authority; PCT/JP2012/077977 issued on May 15, 2014.

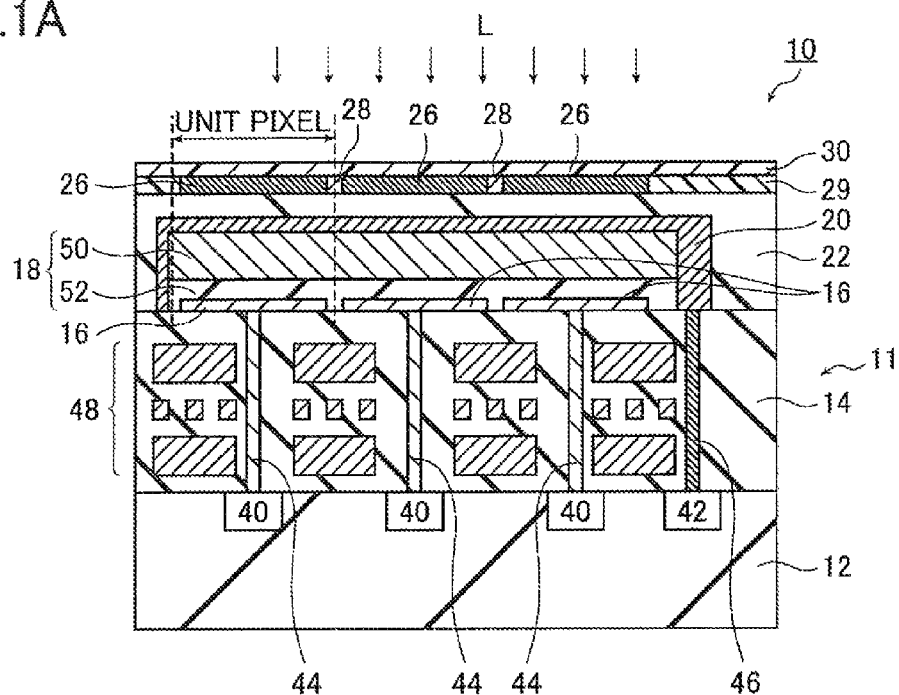
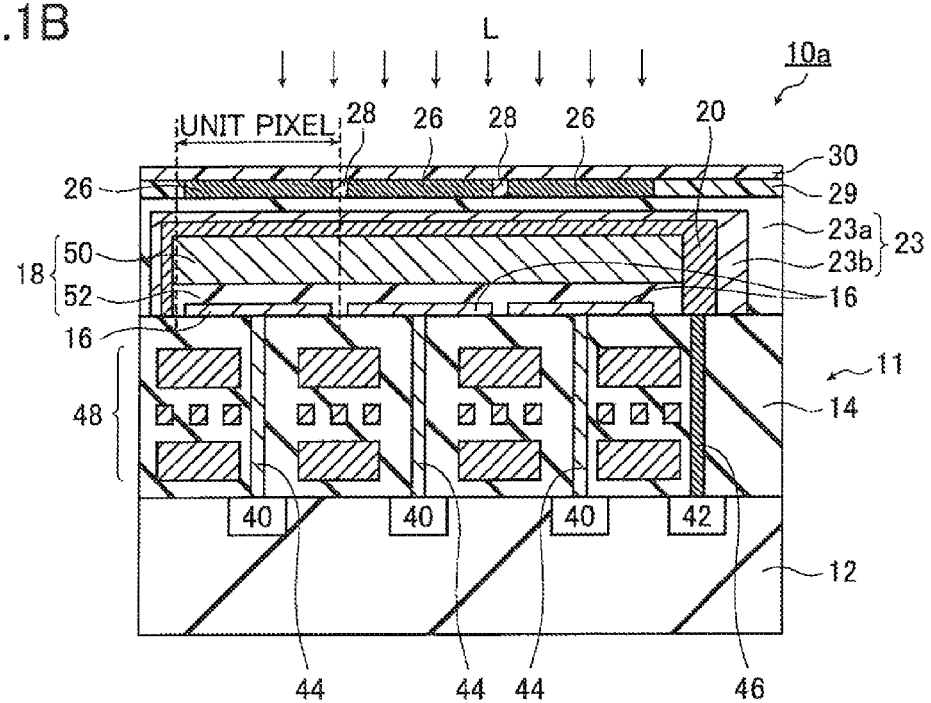

COMPRESSIVE STRESS

TENSILE STRESS

IMAGING DEVICE AND METHOD FOR MANUFACTURING IMAGING DEVICE

CROSS-REFERENCE TO RELATED APPLICATIONS

This application is a continuation application of International Application PCT/JP2012/077977 filed on Oct. 30, 2012, which claims priority under 35 U.S.C. 119(a) to Application No. 2011-238985 filed in Japan on Oct. 31, 2011 and Application No. 2012-238281 filed in Japan on Oct. 29, 2012, all of which are hereby expressly incorporated by reference into the present application.

BACKGROUND OF THE INVENTION

The present invention relates to an imaging device which has an organic layer (photoelectric conversion layer) generating electric charges in accordance with received light and converts a visible light image to electrical signals. The invention more specifically relates to an imaging device capable of suppressing adverse effects of any defect in a protective film for protecting an upper electrode (counter electrode).

Solid-state imaging devices (so-called CCD sensors and CMOS sensors) in which photodiode-containing pixels are arranged on a semiconductor substrate such as a silicon (Si) chip and signal charges corresponding to photoelectrons generated in photodiodes of the respective pixels are acquired in CCD and CMOS readout circuits are widely known as image sensors utilized in, for example, a digital still camera, a digital video camera, a camera for a cellular phone and a camera for an endoscope.

In recent years, a solid-state imaging device including an organic photoelectric conversion layer which uses an organic material and generates electric charges in accordance with received light has been studied.

A solid-state imaging device having an organic photoelectric conversion layer includes pixel electrodes formed on a semiconductor substrate having signal readout circuits formed therein, the organic photoelectric conversion layer formed on the pixel electrodes, a counter electrode (upper electrode) formed on the organic photoelectric conversion layer, a protective film formed on the counter electrode for protecting the counter electrode, color filters and the like.

In the solid-state imaging device, a bias voltage is applied between the pixel electrodes and the counter electrode to cause excitons generated in the organic photoelectric conversion layer to be separated into electrons and holes, and signals corresponding to electric charges of the electrons or holes transferred to the pixel electrodes according to the bias voltage are acquired in CCD or CMOS signal readout circuits.

In such a solid-state imaging device having an organic photoelectric conversion layer, the organic photoelectric conversion layer is known to deteriorate due to, for example, moisture and oxygen, and various methods for suppressing the deterioration of the organic photoelectric conversion layer have been proposed (see JP 2004-165512 A and JP 2006-245045 A).

JP 2004-165512 A discloses an organic photoelectric conversion element which includes an organic layer disposed between two electrodes, one of which is translucent, and generating electric charges in response to irradiation with light, the organic layer having a surface protective layer formed on its surface, and the surface protective layer including an inorganic sealing layer formed by a vapor deposition process and a resin layer formed on the inorganic sealing layer. The inorganic sealing layer has an internal stress of −1 GPa to +1 GPa. In this case, the positive value indicates tensile stress and the negative value indicates compressive stress.

JP 2006-245045 A discloses a photoelectric conversion layer-stacked solid-state image pickup element in which a protective layer made of an inorganic material is formed on a transparent counter electrode and which makes use of an organic semiconductor.

It is disclosed that the inorganic material making up the protective layer is silicon oxide, silicon nitride or silicon oxynitride and the protective layer is formed by plasma CVD.

SUMMARY OF THE INVENTION

A solid-state imaging device having an organic photoelectric conversion layer has color filters, and liquids such as a developer and a stripper are used in the step of forming the color filters (forming an organic film pattern). The developer and the stripper are liquids for dissolving the organic photoelectric conversion layer made of an organic film and the organic photoelectric conversion layer is immersed in these liquids in the color filter-forming step.

Then, if a protective film has a defective portion due to dust or the like, the developer and the stripper are allowed to penetrate the protective film in the color filter-forming step and an organic solvent may reach the organic photoelectric conversion layer made of an organic film. The organic photoelectric conversion layer thereby swells, and if there are no constraints placed on the protective film by the organic photoelectric conversion layer, energy of the protective film is released. A larger internal stress of the protective film causes a larger amount of energy to be released, and the protective film may come off in a short period of time. The protective film that came off will contaminate the developer and the stripper. The thus contaminated developer and stripper will further spread contamination.

The present invention has been accomplished with a view to solving the foregoing prior art problems and an object of the present invention is to provide an imaging device capable of suppressing adverse effects of any defect which may occur in a protective layer for protecting a counter electrode (upper electrode).

In order to achieve the above object, a first aspect of the present invention provides an imaging device comprising: a substrate; lower electrodes formed on the substrate; an organic layer formed on the lower electrodes and adapted to generate electric charges in response to irradiation with light; an upper electrode formed on the organic layer and adapted to transmit the light; a protective film formed on the upper electrode; and a patterned organic film formed on the protective film, wherein the protective film comprises at least one layer and has a total thickness of 30 to 500 nm, wherein the protective film of a single layer type has an internal stress of −50 MPa to +60 MPa in a whole of the protective film, wherein in the protective film of a two-layer type including a lower protective film and an upper protective film, the lower protective film has a thickness of 50 nm or less, and when the lower protective film is thinner than the upper protective film, the internal stress in the whole of the protective film satisfies an expression: $-4.6x-50 \leq y \leq -1.67x+60$ when x is in a range of $0 < x < 15$ and satisfies an expression: $-1.25x-100 \leq y < 0$ when x is in a range of $15 \leq x \leq 50$, where the thickness of the lower protective film is denoted by x (nm) and the internal stress in the whole of the protective film is denoted by y (MPa), and wherein, when the lower protective film is thicker than the upper protective film, the internal stress in the whole of the protective film is in a range of $0<y\leq+115$ when x is in a range of $15<x\leq50$.

Preferably, the protective film comprises two layers.

A second aspect of the present invention provides an imaging device comprising: a substrate; lower electrodes formed on the substrate; an organic layer formed on the lower electrodes and adapted to generate electric charges in response to irradiation with light; an upper electrode formed on the organic layer and adapted to transmit the light; a protective film formed on the upper electrode; and a patterned organic film formed on the protective film, wherein the protective film comprises two layers including a lower protective film and an upper protective film and has a total thickness of 30 to 500 nm, wherein the lower protective film has a thickness of at least 15 nm but 50 nm or less, wherein, when the lower protective film is thinner than the upper protective film, an internal stress in a whole of the protective film satisfies an expression: $-1.25x-100\leq y<0$, where the thickness of the lower protective film is denoted by x (nm) and the internal stress in the whole of the protective film is denoted by y (MPa), and wherein, when the lower protective film is thicker than the upper protective film, the internal stress in the whole of the protective film is in a range of $0<y\leq+115$ when x is in a range of $15<x\leq50$.

Preferably, the protective film of the single layer type comprises a silicon oxynitride film, and in the protective film of the two-layer type, the upper protective film comprises a silicon oxynitride film.

The lower protective film preferably comprises aluminum oxide.

For instance, the light includes at least visible light, the organic layer generates the electric charges in response to the irradiation with the light including at least the visible light, and the upper electrode comprises a conductive material which is transparent to the light including at least the visible light.

The organic layer preferably comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

An organic thin film is preferably formed between the protective film and the patterned organic film. The organic thin film preferably has a thickness of 10 to 200 nm.

A third aspect of the present invention provides an imaging device comprising: a substrate; lower electrodes formed on the substrate; an organic layer formed on the lower electrodes and adapted to generate electric charges in response to irradiation with light; an upper electrode formed on the organic layer and adapted to transmit the light; a protective film formed on the upper electrode; a patterned organic film formed on the protective film; and an organic thin film formed by coating between the protective film and the patterned organic film, wherein the protective film comprises at least one layer and has a total thickness of 30 to 500 nm.

In this case, preferably, the light includes at least visible light, the organic layer generates the electric charges in response to the irradiation with the light including at least the visible light, and the upper electrode comprises a conductive material which is transparent to the light including at least the visible light.

The organic layer preferably comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

A fourth aspect of the present invention provides a method for manufacturing an imaging device comprising: a substrate; lower electrodes formed on the substrate; an organic layer formed on the lower electrodes and adapted to generate electric charges in response to irradiation with light; an upper electrode formed on the organic layer and adapted to transmit the light; a protective film formed on the upper electrode; and a patterned organic film formed on the protective film, the protective film comprising a lower protective film formed on the upper electrode and an upper protective film formed on the lower protective film, the method comprising: a step of forming the lower protective film at a substrate temperature of 100° C. to 200° C. using an atomic layer deposition process; and a step of forming the upper protective film at a substrate temperature of 150° C. to 250° C. using a plasma CVD process.

According to the present invention, even if a protective film for protecting an upper electrode has a defect, adverse effects that may be caused by the defect in the manufacturing process can be suppressed. Consistent manufacture can be thereby achieved. The present invention can also be applied to a film for protecting an organic electroluminescent (organic EL) film.

By forming an organic thin film between a protective film and a patterned organic film, peeling of the protective film can be suppressed while improving the yield of the imaging device.

BRIEF DESCRIPTION OF THE DRAWINGS

FIG. 1A is a schematic cross-sectional view showing an imaging device according to a first embodiment of the invention; and FIG. 1B is a schematic cross-sectional view showing a modified example of the imaging device according to the first embodiment of the invention.

DETAILED DESCRIPTION OF THE INVENTION

Figure 2A:
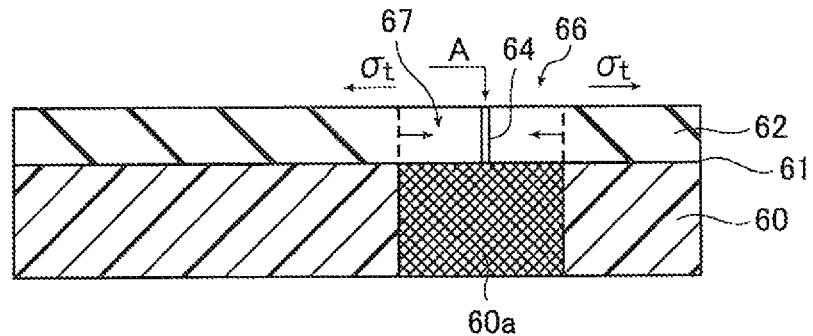
FIG. 2A is a schematic cross-sectional view for illustrating peeling of a film.

On the following pages, the imaging device of the present invention will be described in detail with reference to preferred embodiments shown in the accompanying drawings. FIG. 1A is a schematic cross-sectional view showing an imaging device according to a first embodiment of the invention; and FIG. 1B is a schematic cross-sectional view showing a modified example of the imaging device according to the first embodiment of the invention.

The imaging device according to the first embodiment of the present invention can be used in imaging apparatuses such as digital cameras and digital video cameras. The imaging device can also be used by being mounted on imaging modules and the like of electronic endoscopes, cellular phones, and the like.

For instance, an imaging device 10 shown in FIG. 1A receives incident light L containing at least visible light and converts an image of the visible light to electrical signals, and includes a substrate 12, an insulating layer 14, pixel electrodes (lower electrodes) 16, an organic layer 18, a counter electrode (upper electrode) 20, a protective film (sealing layer) 22, color filters (patterned organic film) 26, partitions 28, a light shielding layer 29, and an overcoat layer 30.

In the substrate 12, readout circuits 40 and a voltage supply portion 42 which applies voltage to the counter electrode are formed.

In the imaging device 10, visible light is not the sole light converted to electrical signals but light in a wavelength range other than that of the visible light may be converted to electrical signals.

As the substrate 12, for example, a glass substrate or a semiconductor substrate such as a silicon substrate is used. On the substrate 12, the insulating layer 14 made of a known insulating material is formed. On a surface of the insulating layer 14, the pixel electrodes 16 are formed. The pixel electrodes 16 are arranged, for example, in a one-dimensional or two-dimensional array.

Moreover, first connection portions 44 which connect the pixel electrodes 16 to the readout circuits 40 and a second connection portion 46 which connects the counter electrode 20 to the voltage supply portion 42 are formed in the insulating layer 14. The second connection portion 46 is formed at a position where connection to the pixel electrodes 16 and the organic layer 18 is not established. The first connection portions 44 and the second connection portion 46 are made of a conductive material.

A wiring layer 48 which is, for example, used to connect the readout circuits 40 and the voltage supply portion 42 to the outside of the imaging device 10 and is made of a conductive material is formed inside the insulating layer 14.

As described above, the pixel electrodes 16 connected to the respective first connection portions 44 are formed on a surface 14a of the insulating layer 14 on the substrate 12, and this structure is called a circuit board 11. The circuit board 11 is also called a CMOS board.

The organic layer 18 is formed so as to cover the pixel electrodes 16 and to keep from approaching the second connection portion 46. The organic layer 18 receives incident light L containing at least visible light and generates electric charges according to the amount of the light, and includes a photoelectric conversion layer 50 and an electron blocking layer 52.

In the organic layer 18, the electron blocking layer 52 is formed on the side closer to the pixel electrodes 16, and the photoelectric conversion layer 50 is formed on the electron blocking layer 52. The organic layer 18 may not include the electron blocking layer 52 but be a single layer only including the photoelectric conversion layer 50.

The electron blocking layer 52 is a layer for suppressing injection of electrons into the photoelectric conversion layer 50 from the pixel electrodes 16.

The photoelectric conversion layer 50 generates electric charges according to the amount of incident light L, for example, received light such as visible light and contains an organic photoelectric conversion material. Each of the photoelectric conversion layer 50 and the electron blocking layer 52 should have a constant thickness only above the pixel electrodes 16. The photoelectric conversion layer 50 will be described later in detail.

The counter electrode 20 is an electrode opposed to the pixel electrodes 16 and covers the photoelectric conversion layer 50. The photoelectric conversion layer 50 is disposed between the pixel electrodes 16 and the counter electrode 20.

The counter electrode 20 is made of a conductive material which is transparent to incident light L (light containing at least visible light) so as to allow light to enter the photoelectric conversion layer 50. The counter electrode 20 is electrically connected to the second connection portion 46 disposed outside the photoelectric conversion layer 50, and is connected to the voltage supply portion 42 through the second connection portion 46.

Examples of the material of the counter electrode 20 include metals, metal oxides, metal nitrides, metal borides, organic conductive compounds, and mixtures thereof. Specific examples thereof include conductive metal oxides such as tin oxide, zinc oxide, indium oxide, indium tin oxide (ITO), indium zinc oxide (IZO), indium tungsten oxide (IWO), and titanium oxide; metal nitrides such as titanium nitride (TiN); metals such as gold (Au), platinum (Pt), silver (Ag), chromium (Cr), nickel (Ni), and aluminum (Al); mixtures or laminates consisting of these metals and conductive metal oxides; organic conductive compounds such as polyaniline, polythiophene, and polypyrrole; laminates consisting of these organic conductive compounds and ITO. Any of the materials including ITO, IZO, tin oxide, antimony-doped tin oxide (ATO), fluorine-doped tin oxide (PTO), zinc oxide, antimony-doped zinc oxide (AZO) and gallium-doped zinc oxide (GZO) is most preferably used as the material of the transparent conductive film. Of the materials of the counter electrode 20, ITO is the most preferable material.

The optical transmittance of the counter electrode 20 at a visible light wavelength is preferably 60% or higher, more preferably 80% or higher, even more preferably 90% or higher, and still more preferably 95% or higher.

Moreover, it is preferable for the counter electrode 20 to have a thickness of 5 to 30 nm. If the counter electrode 20 has a film thickness of 5 nm or more, the electrode can sufficiently cover the underlying layer, and uniform performance is obtained. On the other hand, if the film thickness of the counter electrode 20 exceeds 30 nm, a short circuit locally occurs between the counter electrode 20 and the pixel electrodes 16, whereby dark current may increase. Occurrence of a local short circuit can be prevented by reducing the film thickness of the counter electrode 20 to 30 nm or less.

The voltage supply portion 42 applies a predetermined voltage to the counter electrode 20 through the second connection portion 46. When the voltage to be applied to the counter electrode 20 is higher than the power supply voltage of the imaging device 10, the voltage supply portion 42 increases the power supply voltage by using a booster circuit such as a charge pump and supplies the predetermined voltage.

The pixel electrodes 16 are electric charge-collecting electrodes for collecting electric charges generated in the organic layer 18 (photoelectric conversion layer 50) disposed between the pixel electrodes 16 and the counter electrode 20 opposed to the pixel electrodes 16. The pixel electrodes 16 are connected to the readout circuits 40 through the first connection portions 44. The readout circuits 40 are disposed in the substrate 12 so as to correspond to their respective pixel electrodes 16. The readout circuits 40 read out signals in accordance with the electric charges collected by the corresponding pixel electrodes 16.

The material of the pixel electrodes 16 should have electrical conductivity and examples thereof include metals, conductive metal oxides, conductive metal nitrides, conductive metal borides, organic conductive compounds, and mixtures thereof. Specific examples thereof include conductive metal oxides such as tin oxide, zinc oxide, indium oxide, indium tin oxide (ITO), indium zinc oxide (IZO), indium tungsten oxide (IWO), and titanium oxide; conductive metal nitrides such as titanium nitride (TiN), molybdenum nitride, tantalum nitride and tungsten nitride; metals such as gold (Au), platinum (Pt), silver (Ag), chromium (Cr), nickel (Ni), and aluminum (Al); mixtures or laminates consisting of these metals and conductive metal oxides; organic conductive compounds such as polyaniline, polythiophene, and polypyrrole; laminates consisting of these organic conductive compounds and ITO. Any of the materials including ITO, IZO, tin oxide, antimony-doped tin oxide (ATO), fluorine-doped tin oxide (PTO), zinc oxide, antimony-doped zinc oxide (AZO) and gallium-doped zinc oxide (GZO) is most preferably used as the material of the transparent conductive film. Of the materials of the pixel electrodes 16, any of titanium nitride, molybdenum nitride, tantalum nitride, and tungsten nitride is the most preferable material.

When a step height corresponding to the thickness of the pixel electrode 16 is steep at the edge of the pixel electrodes 16, when the surface of the pixel electrode 16 has marked irregularities, or when fine dust (particles) adheres onto the pixel electrodes 16, the thickness of the photoelectric conversion layer 50 or the electron blocking layer 52 overlying the pixel electrodes 16 becomes smaller than a desired thickness or cracks occur in the layer. If the counter electrode 20 is formed on these layers in such a state, pixel defects such as increased dark current and short circuit occur due to the contact between any of the pixel electrodes 16 and the counter electrode 20 and concentration of an electric field in the defective portion. Moreover, the defects described above may deteriorate adhesiveness between the pixel electrodes 16 and the layer overlying the pixel electrodes 16 or heat resistance of the imaging device 10.

In order to prevent the above defects and improve reliability of the device, the pixel electrodes 16 preferably have a surface roughness Ra of 0.6 nm or less. A smaller surface roughness Ra of the pixel electrodes 16 means a smaller surface unevenness and hence the surface has good flatness. In order to remove particles on the pixel electrodes 16, it is particularly preferable to clean the pixel electrodes 16 and the like by using a common cleaning technique which is used in a semiconductor manufacturing process, before the electron blocking layer 52 is formed.

The readout circuit 40 is constituted with, for example, a CCD, MOS or TFT circuit, and is shielded from light by a light shielding layer (not shown) disposed in the insulating layer 14. When used for a general image sensor, the readout circuit 40 is preferably constituted with a CCD or CMOS circuit. In view of noise and high-speed performance, a CMOS circuit is preferably used.

Although not shown, for example, an n-region at a high concentration that is surrounded by a p-region is formed in the substrate 12. The n-region is connected to the first connection portions 44, and the readout circuits 40 are disposed in the p-region. The n-region functions as an electric charge accumulating portion that accumulates electric charges of the photoelectric conversion layer 50. The signal electric charges accumulated in the n-region are converted into signals by the readout circuits 40 according to the amount of the electric charges, and are output to the outside of the imaging device 10 through, for example, the wiring layer 48.

The protective film 22 functions as a sealing film and protects the organic layer 18 including the photoelectric conversion layer 50 against deterioration factors such as water molecules and oxygen. The protective film 22 is formed so as to cover the counter electrode 20.

In each manufacturing step of the imaging device 10, the protective film 22 protects the organic layer 18 against penetration of an organic solvent or other factors that are included in, for example, a solution or a plasma and may deteriorate the organic photoelectric conversion material. After the imaging device 10 is manufactured, factors such as water molecules and oxygen that may deteriorate the organic photoelectric conversion material are prevented from penetrating the organic layer 18 to protect the organic layer 18 against deterioration during a long-term storage and a long-term usage. In addition, at the time of formation of the protective film 22, the protective film 22 does not deteriorate the organic layer 18 that has already been formed. Furthermore, incident light (visible light) reaches the organic layer 18 through the protective film 22. Therefore, the protective film 22 is transparent to light at a specific wavelength as detected by the organic layer 18 (e.g., visible light).

The protective film 22 is made up of at least one layer and the protective film 22 in the example of FIG. 1A is of a single layer structure. The protective film 22 is made of, for example, a silicon oxynitride film (SiON film). The protective film 22 is preferably formed by, for example, a vapor deposition process. Examples of the vapor deposition process that may be used include plasma CVD, sputtering, reactive sputtering and ion plating.

When the protective film 22 is of a single layer structure, the internal stress in the whole of the protective film 22 (the internal stress in the whole of the protective film 22 is hereinafter referred to simply as "internal stress") is from −50 MPa to +60 MPa, and the total film thickness is from 30 to 500 nm. In the internal stress as used herein, the negative sign indicates compressive stress and the positive sign indicates tensile stress.

As will be illustrated with reference to a specific example, the protective film 22 comes off if the internal stress exceeds +60 MPa.

Figure 2B:
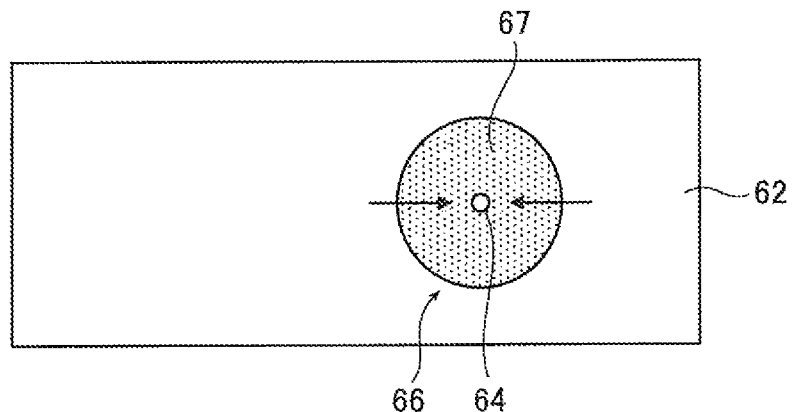
FIG. 2B is a top view of the film shown in FIG. 2A.

To be more specific, a case in which an electrode 61 corresponding to the counter electrode (upper electrode) 20 is formed on an organic film 60 corresponding to the organic layer 18 and a protective film 62 corresponding to the protective film 22 is formed on the electrode 61 as shown in FIG. 2A is described by way of example. In this case, the tensile stress $\sigma_t$ acts on the protective film 62 as the internal stress. In a case where the protective film 62 has a defect such as a hole 64, as a result of the defect, an organic solvent A or the like passes through the hole 64 in a subsequent step for manufacturing color filters using a photolithographic process and penetrates the organic film 60, which is thereby swelled. The strength of bonding between the electrode and the organic film is lost at a portion 66 of the protective film 62 corresponding to a swelled region 60a. The protective film 62 having a tensile stress inherently tends to contract and hence deforms so as to relax the stress by forming a crack. In this way, a part 67 of the portion 66 of the protective film 62 shown in FIG. 2B comes off or cracks occur in the portion 66 of the protective film 62. If the internal stress of the protective film 22 thus exceeds +60 MPa, a part of the protective film 62 comes off or cracks occur in the protective film 62.

As will be illustrated with reference to a specific example, the surface of the protective film 22 is wrinkled if the internal stress exceeds −50 MPa in terms of absolute value.

Figure 3A:
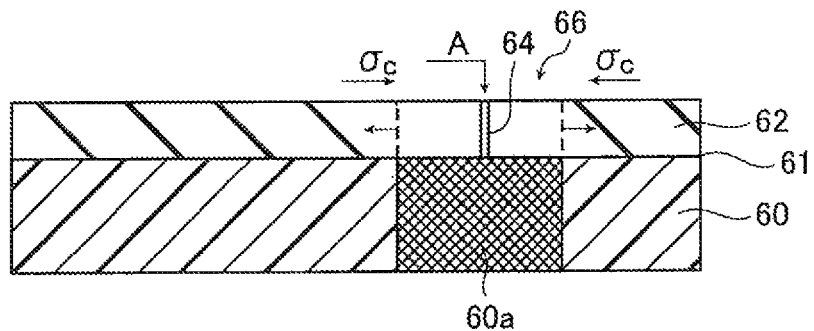
FIG. 3A is a schematic cross-sectional view for illustrating occurrence of wrinkles.
Figure 3B:
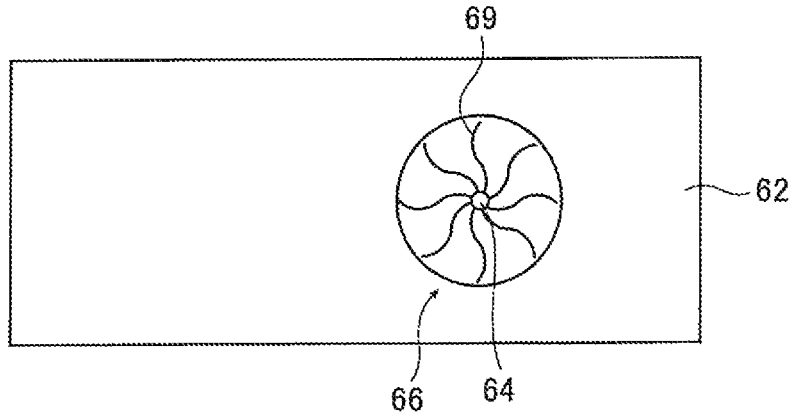
FIG. 3B is a top view of a film shown in FIG. 3A.

To be more specific, a case in which an electrode 61 corresponding to the counter electrode 20 is formed on an organic film 60 corresponding to the organic layer 18 and a protective film 62 corresponding to the protective film 22 is formed on the electrode 61 as shown in FIG. 3A is described by way of example. In this case, the compressive stress $\sigma_c$ acts on the protective film 62 as the internal stress. In a case where the protective film 62 has a defect such as a hole 64, as a result of the defect, an organic solvent A or the like passes through the hole 64 in a subsequent step for manufacturing color filters using a photolithographic process and penetrates the organic film 60, which is thereby swelled. The strength of bonding between the electrode and the organic film is lost at a portion 66 of the protective film 62 corresponding to a swelled region 60a. The protective film 62 having a compressive stress inherently tends to expand and hence deforms so as to relax the stress by forming wrinkles. Wrinkles 69 thereby occur at the portion 66 of the protective film 62 corresponding to the swelled region 60a as shown in FIG. 3B. The protective film 22 is thus wrinkled if the internal stress exceeds −50 MPa in terms of absolute value, that is, if the internal stress as the compressive stress exceeds 50 MPa.

However, even if the protective film 62 has a defect such as the hole 64 as shown in FIGS. 2A and 3A, and the organic solvent A or the like passes through the hole 64, and penetrates and swells the organic film 60 during the manufacture of color filters using a photolithographic process, changes, film peeling and wrinkles do not occur in the protective film 62 by adjusting the internal stress of the protective film 22 in a range of −50 MPa to +60 MPa.

In this embodiment, the protective film 22 has a total thickness of 30 to 500 nm.

When the total thickness of the protective film 22 is less than 30 nm, the barrier properties or the resistance of the color filters to developers may deteriorate. On the other hand, when the thickness of the protective film 22 exceeds 500 nm, color mixing is difficult to suppress at a pixel size of less than 1 μm.

In the imaging device 10 according to the embodiment under consideration, the protective film 22 is of a single layer structure but is not limited thereto. For instance, the protective film 22 may be of a two-layer structure as in a protective film 23 of an imaging device 10a shown in FIG. 1B including, for example, a first protective film 23a and a second protective film 23b.

In this case, the second protective film 23b (lower protective film) is formed on the counter electrode 20 and the first protective film 23a (upper protective film) is formed thereon.

In other words, the second protective film 23b is formed between the first protective film 23a and the counter electrode 20. The first protective film 23a is configured in the same manner as the above-described protective film 22, so its detailed description will be omitted.

The protective film 23 is also preferably formed by a vapor deposition process. That is, the first protective film 23a and the second protective film 23b are preferably formed by a vapor deposition process. Examples of the vapor deposition process that may be used include plasma CVD, sputtering, reactive sputtering, ion plating and atomic layer deposition.

The protective film 23 of a two-layer structure as well as the protective film 22 has a total thickness of 30 to 500 nm. In this case, the thickness of the second protective film 23b is more than 0 nm but up to 50 nm.

The second protective film 23b as well as the first protective film 23a is transparent to, for example, visible light. Film peeling (cracks) and wrinkles may occur in the second protective film 23b at a film thickness exceeding 50 nm and hence the film thickness is preferably up to 50 nm. It should be noted that the thickness lower limit of the second protective film 23b is more than 0 nm but is preferably 1 nm.

The second protective film 23b is preferably made of, for example, aluminum oxide ($AlO_x$), silicon oxide ($SiO_x$) or silicon nitride ($SiN_x$). Of these, aluminum oxide ($AlO_x$) is most preferable. The second protective film 23b made of aluminum oxide is formed by, for example, an atomic layer deposition process such as an atomic layer chemical vapor deposition (ALCVD) process.

Figure 4:
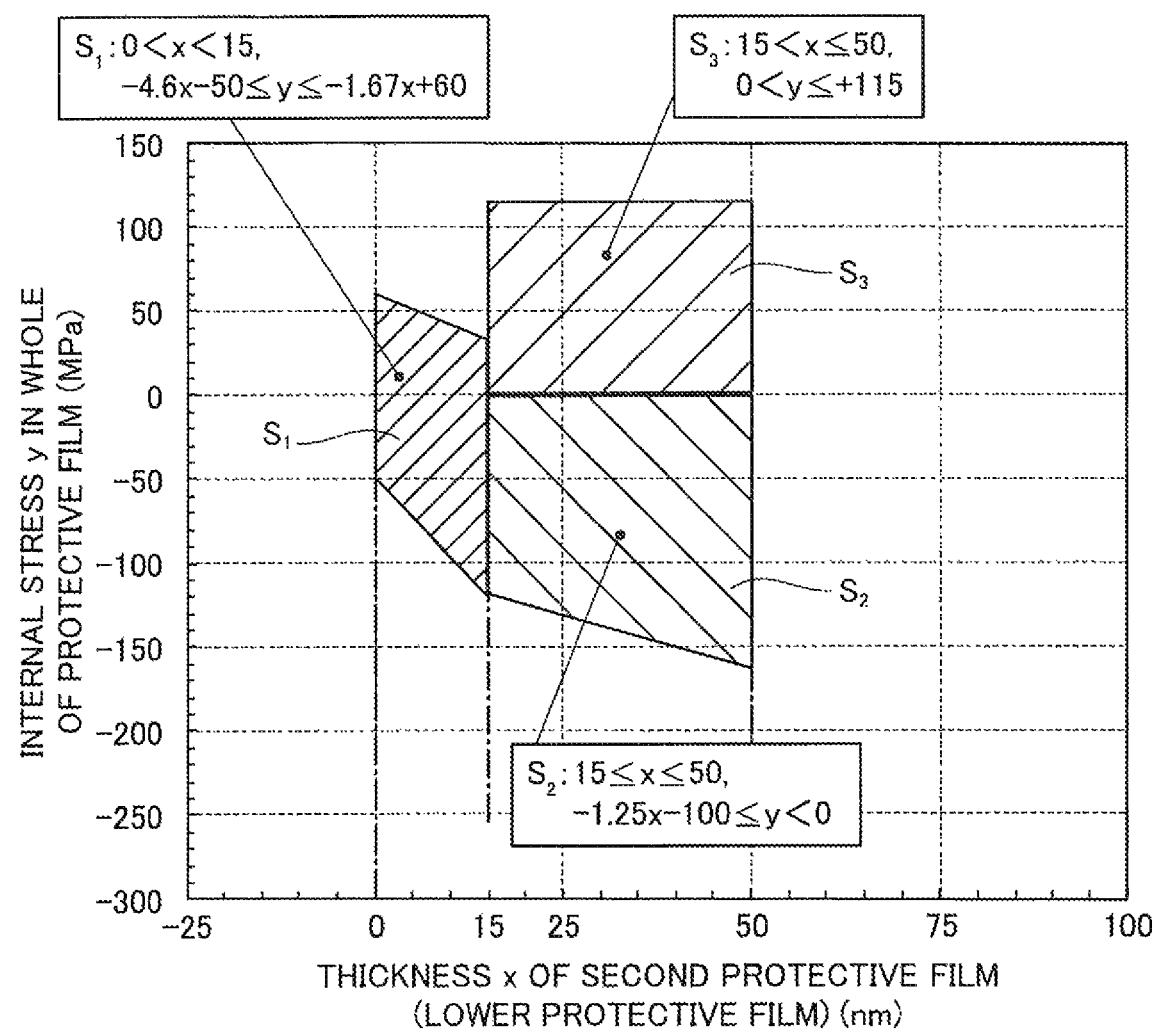
FIG. 4 is a graph showing a relation between the internal stress in the whole of a protective film and the thickness of a second protective film (lower protective film).

In the protective film 23 of a two-layer structure, the internal stress range differs depending on the thickness z of the first protective film 23a and the thickness x of the second protective film 23b and is as shown in FIG. 4. In FIG. 4, the vertical axis indicates the internal stress y (MPa) in the whole of the protective film and the horizontal axis indicates the thickness x (nm) of the second protective film 23b (lower protective film). This second protective film 23b (lower protective film) is made of aluminum oxide ($AlO_x$).

When the thickness of the second protective film 23b (lower protective film) is represented by x (nm) and the internal stress in the whole of the protective film by y (MPa), if the second protective film 23b is thinner than the first protective film 23a, in other words, if the thickness x of the second protective film 23b is smaller than the thickness z of the first protective film 23a, the internal stress y (MPa) in the whole of the protective film 23 satisfies the expression: $-4.6x-50 \le y \le -1.67x+60$ ... (1) when x is in a range of $0<x<15$, and satisfies the expression: $-1.25x-100 \le y<0$ ... (2) when x is in a range of $15 \le x \le 50$.

If the second protective film 23b is thinner than the first protective film 23a, when the thickness x of the second protective film 23b is in a range of $0<x<15$ and the internal stress satisfies the expression: $-4.6x-50$ (MPa)$>y$, the compressive stress increases to cause wrinkles in the protective film 23. On the other hand, when the internal stress satisfies the expression: $y>-1.67x+60$ (MPa), the tensile stress increases to cause film peeling or cracks in the protective film 23.

If the second protective film 23b is thinner than the first protective film 23a, when the thickness x of the second protective film 23b is in a range of $15 \le x \le 50$ and the internal stress satisfies the expression: $-1.25x-100$ (MPa)$>y$, the compressive stress increases to cause wrinkles in the protective film 23. On the other hand, when the internal stress is in a range of $y \ge 0$ (MPa), the tensile stress increases to cause wrinkles in the protective film 23.

If the second protective film 23b is thinner than the first protective film 23a, occurrence of film peeling and occurrence of wrinkles or cracks in the protective film 23 are suppressed within the ranges satisfying the expressions (1) and (2). The range of (1) is expressed by a region $S_1$ in FIG. 4 and the range of (2) is expressed by a region $S_2$ in FIG. 4.

If the thickness of the second protective film 23*b* is equal to or larger than that of the first protective film 23*a*, that is, if the expression: the thickness x of the second protective film 23*b*≥thickness z of the first protective film 23*a* is satisfied, the internal stress y (MPa) in the whole of the protective film 23 is in a range of $0 < y \le +115$ ... (3) when the thickness x (nm) of the second protective film 23*b* is in a range of $15 < x \le 50$.

In this case, when the internal stress is in a range of $0 \ge y$ (MPa), the compressive stress increases to cause wrinkles in the protective film 23. On the other hand, when the internal stress is in a range of $y > +115$ (MPa), the tensile stress increases to cause film peeling or cracks in the protective film 23.

If the thickness of the second protective film 23*b* is equal to or larger than that of the first protective film 23*a*, occurrence of film peeling and occurrence of wrinkles or cracks in the protective film 23 are suppressed in the range of (3). The range of (3) is expressed by a region $S_3$ in FIG. 4. Since the second protective film 23*b* is thicker than the first protective film 23*a* in (3), the thickness x of the second protective film 23*b* is in a range of $15 < x \le 50$ in consideration of the minimum film thickness of 30 nm.

In the imaging device 10 having a pixel size of less than 2 μm, particularly about 1 μm, influences of the oblique-incidence component of incident light (visible light) in the protective films 22 and 23 increase with increasing distance between the color filters 26 and the photoelectric conversion layer 50, that is, with increasing thicknesses of the protective film 22 and the protective film 23 (first protective film 23*a* and the second protective film 23*b*), which may cause color mixing. Accordingly, each of the protective films 22 and 23 preferably has a smaller thickness.

The color filters 26 are formed on the protective film 22 at positions corresponding to the respective pixel electrodes 16. The partitions 28 are each disposed between the adjacent color filters 26 on the protective film 22 and are used to improve the light transmission efficiency of the color filters 26. The light shielding layer 29 is formed on the protective film 22 in the region other than the area where the color filters 26 and the partitions 28 are formed (effective pixel area). The light shielding layer 29 prevents light from entering the photoelectric conversion layer 50 formed in the region other than the effective pixel area. The color filters 26, the partitions 28, and the light shielding layer 29 are formed by, for example, a photolithographic process.

The overcoat layer 30 is provided to protect the color filters 26 during the subsequent steps and the like, and is formed so as to cover the color filters 26, the partitions 28, and the light shielding layer 29.

In the imaging device 10, one pixel electrode 16 on which the organic layer 18, the counter electrode 20, and the color filter 26 are formed constitutes a unit pixel.

Polymer materials such as acrylic resins, polysiloxane-based resins, polystyrene-based resins and fluororesins and inorganic materials such as silicon oxide and silicon nitride may be appropriately used for the overcoat layer 30. It is preferable to use a photosensitive resin such as a polystyrene-based resin because the overcoat layer 30 can be patterned by a photolithographic process and hence it is easy to use the photosensitive resin as a photoresist upon formation of openings in the shielding layer, the sealing layer, the insulating layer and the like on the periphery of bonding pads and to process the overcoat layer 30 itself into a microlens. Meanwhile, the overcoat layer 30 can also be used as an antireflection layer, and it is also preferable to form any of various low-refractive index materials used for the partitions 28 between the color filters 26 into a film. Moreover, in order to serve as the protective layer during the subsequent steps and also as the antireflection layer, the overcoat layer 30 may be of a structure including two or more layers composed of a combination of the above materials.

In the embodiment under consideration, the pixel electrodes 16 are formed on the surface of the insulating layer 14. However, the present invention is not limited thereto, and the pixel electrodes 16 may be buried in the surface portion of the insulating layer 14. In addition, the imaging device has the single second connection portion 46 and the single voltage supply portion 42, but the imaging device may have a plurality of these portions. For example, a drop in the voltage of the counter electrode 20 can be suppressed by supplying voltage to the counter electrode 20 from both ends of the counter electrode 20. The number of sets each composed of the second connection portion 46 and the voltage supply portion 42 may be appropriately increased or decreased, in consideration of the chip area of the device.

Hereinafter, the stress of the protective film 22 and the method for measuring the stress will be described.

Figure 5A:
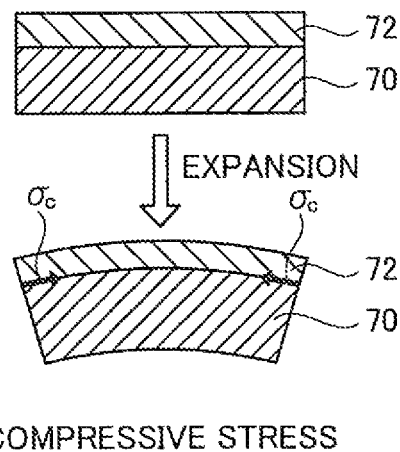
FIGS. 5A and 5B are each a schematic cross-sectional view for illustrating the stress acting on a thin film formed on a substrate.
Figure 5B:
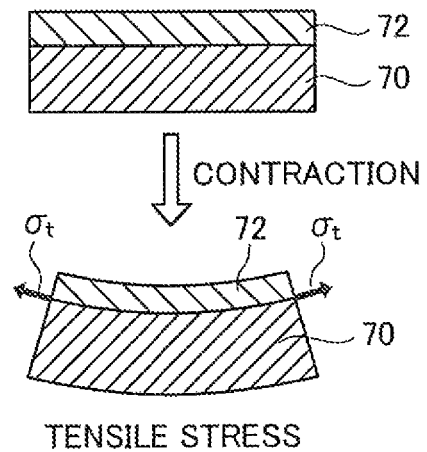

A substrate 70 on which a thin film 72 corresponding to the protective film 22 is formed as shown in FIGS. 5A and 5B is taken as an example to describe the stress acting on the thin film 72 as the stress acting on the protective film 22. Also in the protective film 23 of a two-layer structure including the first protective film 23*a* and the second protective film 23*b*, the stresses of the first protective film 23*a* and the second protective film 23*b* can be determined by measurement in a single-layer state. The internal stress in the whole of the protective film 23 can be determined by measuring the stress of the protective film 23 in which the first protective film 23*a* is formed on the second protective film 23*b*.

In FIG. 5A, directions of a compressive stress $\sigma_c$ acting on the thin film 72 upon expansion of the substrate 70 on which the thin film 72 is formed are indicated by arrows. When the substrate 70 is bent such that the side on which the thin film 72 is formed has a convex shape as in FIG. 5A, the thin film 72 formed on the substrate 70 is expanded, and a compressive force acts on the thin film 72 in close contact with the substrate 70. This force is the compressive stress $\sigma_c$.

In FIG. 5B, directions of a tensile stress $\sigma_t$ acting on the thin film 72 upon contraction of the substrate 70 on which the thin film 72 is formed are indicated by arrows. When the substrate 70 is bent such that the side on which the thin film 72 is formed has a concave shape as in FIG. 5B, the thin film 72 formed on the substrate 70 is contracted, and a tensile force acts on the thin film 72 in close contact with the substrate 70. This force is the tensile stress $\sigma_t$.

The compressive stress $\sigma_c$ and the tensile stress $\sigma_t$ acting on the thin film 72 are influenced by the degree of warpage of the substrate 70. Next, the stress can be measured based on the degree of warpage of the substrate 70 using an optical lever method.

Figure 6:
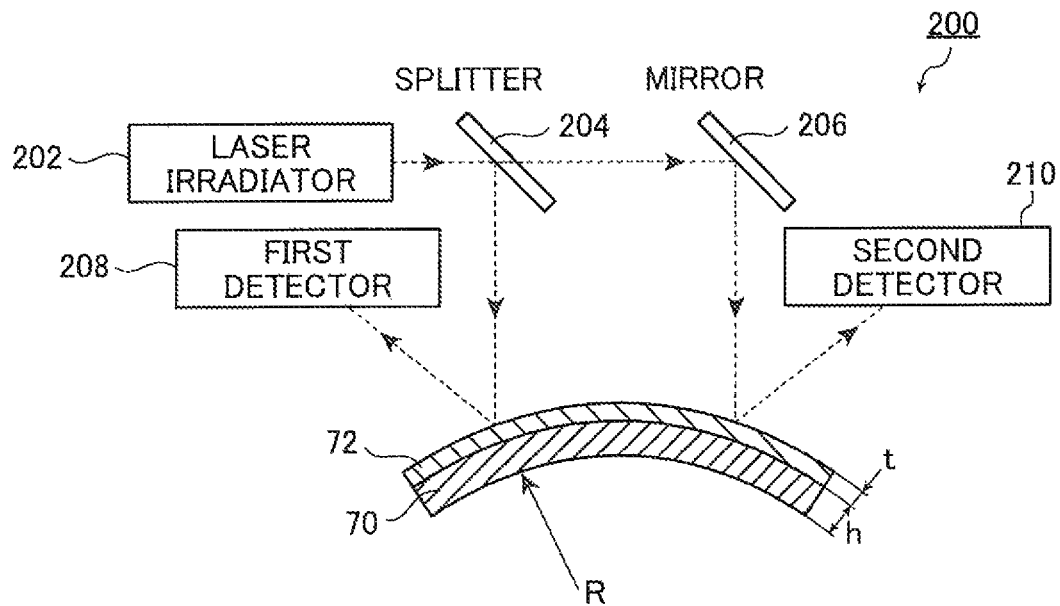
FIG. 6 is a schematic view showing an apparatus for measuring the degree of warpage of a substrate on which a thin film has been formed.

FIG. 6 is a schematic view showing an apparatus for measuring the degree of warpage of a substrate on which a thin film is formed. A measurement apparatus 200 shown in FIG. 6 has a laser irradiator 202 that emits laser light, a splitter 204 that reflects a portion of light emitted from the laser irradiator 202 and transmits the other portion thereof, and a mirror 206 that reflects the light transmitted through the splitter 204. The thin film 72 to be measured is formed on one surface of the substrate 70. The thin film 72 on the substrate 70 is irradiated with the light reflected by the splitter 204, and then, the reflection angle of the light reflected on the surface of the thin film 72 is detected by a first detector 208. The thin film 72 on the substrate 70 is irradiated with the light reflected by the mirror 206, and then, the reflection angle of the light reflected on the surface of the thin film 72 is detected by a second detector 210.

FIG. 6 shows an example in which the compressive stress acting on the thin film 72 is measured by bending the substrate 70 such that the surface on the side where the thin film 72 is formed has a convex shape. Herein, the thickness of the substrate 70 is denoted by h, and the thickness of the thin film 72 is denoted by t.

Next, the measurement procedure of the stress of the thin film using the measurement apparatus 200 will be described.

For example, a thin film stress measuring apparatus FLX-2320-S manufactured by Toho Technology Corporation can be used as the apparatus for use in the measurement. The measurement conditions in the case of using this apparatus are shown below.

Laser light (laser irradiator 202)
Used laser: KLA-Tencor-2320-S
Laser output power: 4 mW
Laser wavelength: 670 nm
Scanning speed: 30 mm/s
Substrate
Substrate material: silicon (Si)
Crystal orientation: <100>
Type: P type (dopant: boron)
Thickness: 250±25 µm or 280±25 µm
   Measurement Procedure The degree of warpage of the substrate 70 on which the thin film 72 will be formed is measured in advance to obtain the radius of curvature R1 of the substrate 70. Subsequently, the thin film 72 is formed on one surface of the substrate 70, and the degree of warpage of the substrate 70 is measured to obtain the radius of curvature R2. Herein, the surface of the substrate 70 on the side where the thin film 72 is formed is scanned by the laser as shown in FIG. 6, and the degree of warpage is calculated from the reflection angle of the laser light reflected by the substrate 70. Based on the obtained degree of warpage, the radius of curvature R is calculated by the following equation: Radius of curvature R=R1·R2/(R1−R2).

Subsequently, the stress of the thin film 72 is calculated by the expression shown below. The stress of the thin film 72 is indicated by a unit Pa. The compressive stress is expressed as a negative value, and the tensile stress is expressed as a positive value. The method for measuring the stress of the thin film 72 is not particularly limited, and known methods can be used.

Expression for calculating stress $$\sigma = E \times h^2 / 6(1-\nu)Rt$$

$E/(1-\nu)$: biaxial elastic modulus (Pa) of the base substrate
$\nu$: poisson ratio
h: thickness (m) of the base substrate
t: thickness (m) of the thin film
R: radius of curvature (m) of the base substrate
σ: average stress (Pa) of the thin film.

Next, the method for manufacturing the imaging device 10 according to the first embodiment of the present invention will be described.

Figure 7A:
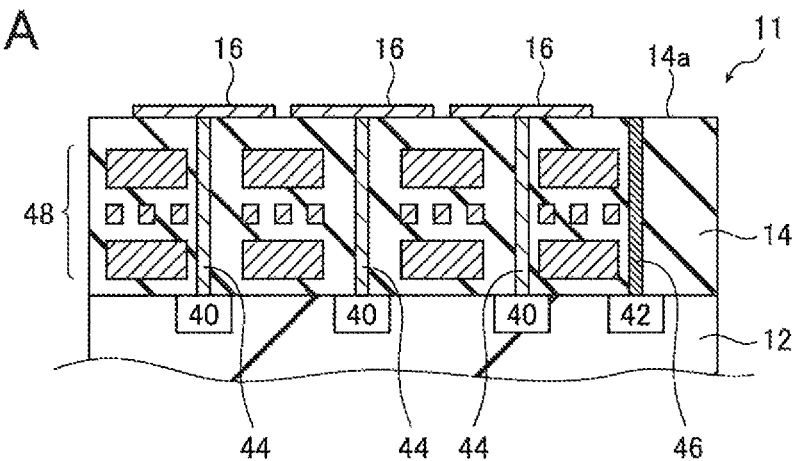
FIGS. 7A to 7C are schematic cross-sectional views showing a method for manufacturing the imaging device according to the first embodiment of the invention in order of steps.

In the method for manufacturing the imaging device 10 according to the embodiment of the present invention, the circuit board 11 (CMOS board) is first prepared in which, as shown in FIG. 7A, the insulating layer 14 including the first connection portions 44, the second connection portion 46 and the wiring layer 48 is formed on the substrate 12 in which the readout circuits 40 and the voltage supply portion 42 that applies voltage to the counter electrode 20 have been formed, and further, the pixel electrodes 16 connected to the respective first connection portions 44 are formed on the surface 14a of the insulating layer 14. In this case, as described above, the first connection portions 44 are connected to the readout circuits 40, and the second connection portion 46 is connected to the voltage supply portion 42. The pixel electrodes 16 are formed of, for example, TiN.

Figure 7B:
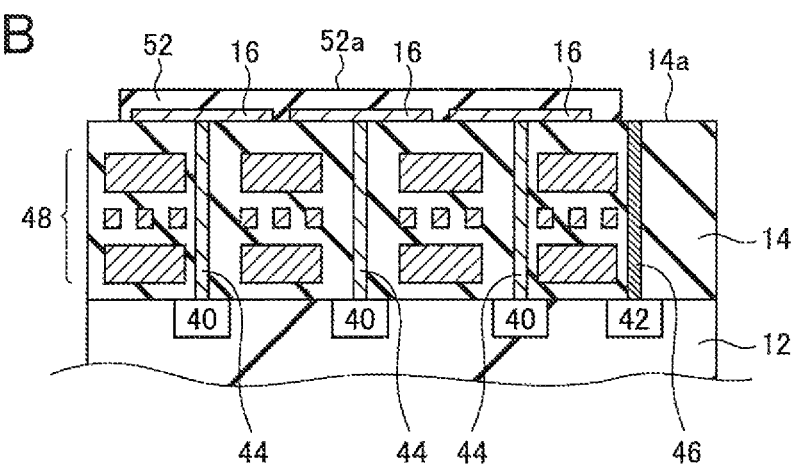

Subsequently, the circuit board 11 is transported along a predetermined transport path to a film formation chamber (not shown) for forming the electron blocking layer 52. As shown in FIG. 7B, an electron blocking material is deposited by, for example, a vapor deposition process at a predetermined degree of vacuum so as to cover all the pixel electrodes 16 except the portion on the second connection portion 46, whereby the electron blocking layer 52 is formed. As the electron blocking material, for example, a carbazole derivative and more preferably a bifluorene derivative is used.

Figure 7C:
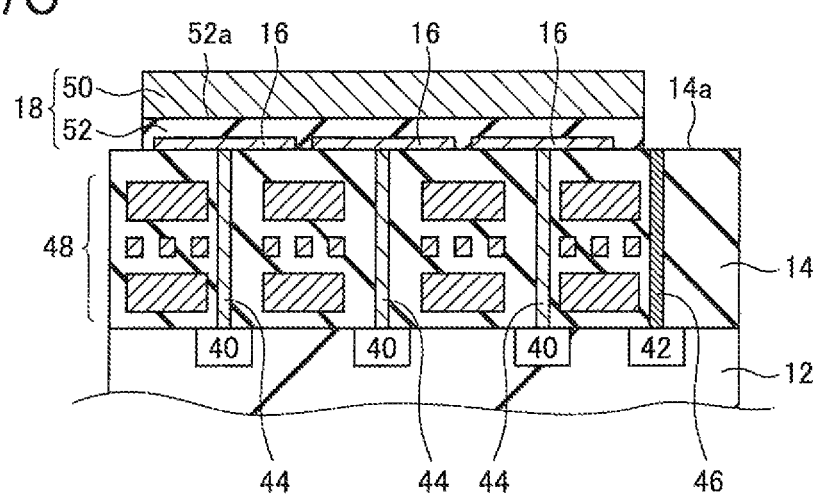

The circuit board 11 having the electron blocking layer 52 formed thereon is then transported along a predetermined transport path to a film formation chamber (not shown) for forming the photoelectric conversion layer 50. As shown in FIG. 7C, the photoelectric conversion layer 50 is formed on a surface 52a of the electron blocking layer 52 by, for example, a vapor deposition process at a predetermined degree of vacuum. As the photoelectric conversion material, for example, a p-type organic semiconductor material and a fullerene or a fullerene derivative are used. The photoelectric conversion layer 50 is thus formed to form the organic layer 18.

Figure 8A:
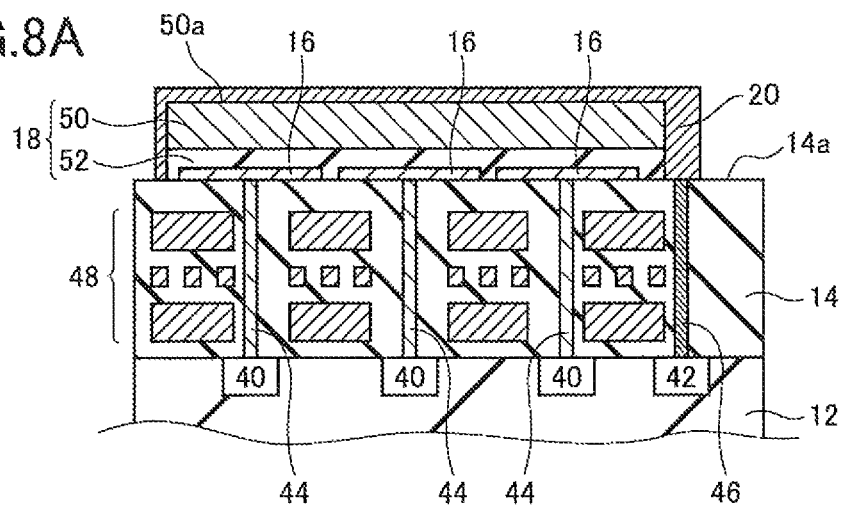
FIGS. 8A and 8B are schematic cross-sectional views showing the method for manufacturing the imaging device according to the first embodiment of the invention in order of steps, and illustrate steps following the step in FIG. 7C.

Then, the circuit board 11 having the organic layer 18 formed thereon is transported along a predetermined transport path to a film formation chamber (not shown) for forming the counter electrode 20. Subsequently, as shown in FIG. 8A, the counter electrode 20 which has a pattern covering the organic layer 18 (the photoelectric conversion layer 50 and the electron blocking layer 52) and formed on the second connection portion 46 is formed by, for example, a sputtering process at a predetermined degree of vacuum.

Figure 8B:
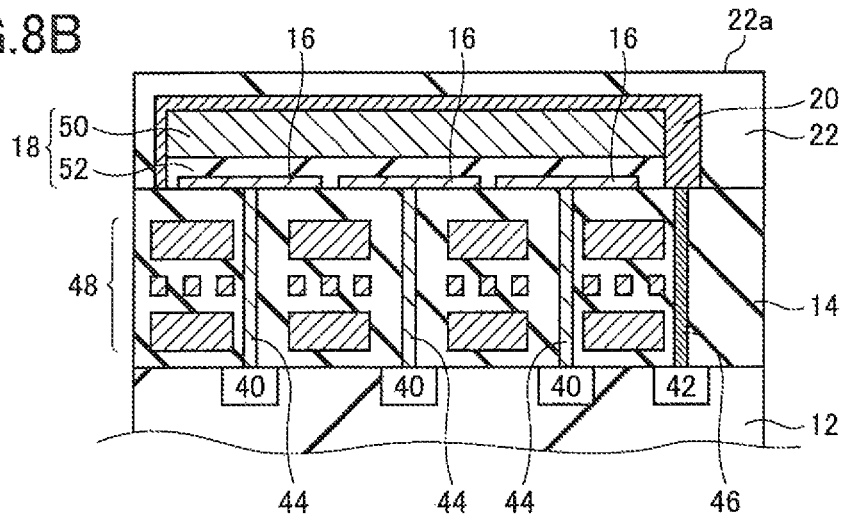

The circuit board 11 having the counter electrode 20 formed thereon is then transported along a predetermined transport path to a film formation chamber (not shown) for forming the protective film 22, and as shown in FIG. 8B, a silicon oxynitride film (SiON film) with a thickness of 300 nm is formed as the protective film 22 on the surface 14a of the insulating layer 14 by, for example, a plasma CVD process so as to cover the counter electrode 20.

In this case, the protective film 22 of a single layer structure, for example, the silicon oxynitride film (SiON film) has an internal stress of −50 MPa to +60 MPa. The protective film 22 is formed by, for example, preliminarily investigating the relationships on the internal stress of the protective film 22 between the film composition, the internal stress and the film forming conditions (e.g., film forming temperature, electric power during film formation, gas type and gas mixing ratio) and depositing to a thickness of 30 to 500 nm under such film forming conditions that the internal stress falls within the above-described range.

Then, the color filters 26, the partitions 28, and the light shielding layer 29 are formed on a surface 22a of the protective film 22 by, for example, a photolithographic process. Known materials for use in organic solid-state imaging devices are used for the color filters 26, the partitions 28, and the light shielding layer 29. The steps for forming the color filters 26, the partitions 28, and the light shielding layer 29 may be performed at a predetermined degree of vacuum or in a non-vacuum environment.

Then, the overcoat layer 30 is formed by, for example, a coating process so as to cover the color filters 26, the partitions 28, and the light shielding layer 29. In this manner, the imaging device 10 shown in FIG. 1A can be formed. Known materials for use in organic solid-state imaging devices are used for the overcoat layer 30. The step for forming the overcoat layer 30 may be performed at a predetermined degree of vacuum or in a non-vacuum environment.

In the embodiment under consideration, even in cases where the protective film 22 has a defect such as a hole and there is a portion where the adhesion between the counter electrode 20 and the photoelectric conversion layer 50 is not sufficient, and as a result, an organic solvent or the like passes through the hole in the manufacture of the color filters 26 by a photolithographic process and further passes through the portion where the adhesion between the counter electrode 20 and the photoelectric conversion layer 50 is not sufficient to penetrate the organic layer 18, thereby swelling the photoelectric conversion layer 50 of the organic layer 18, the protective film 22 does not change by adjusting the internal stress of the protective film as the single layer to −50 MPa and +60 MPa and the total thickness of the protective film to 30 to 500 nm. Film peeling and occurrence of wrinkles can be thereby suppressed. Accordingly, the imaging device 10 can have predetermined performance in a stable manner not only at the time of manufacture but over a long period of time. The imaging device 10 having excellent performance stability and durability can be thus obtained.

In the embodiment under consideration, the protective film 23 may be of a two-layer structure including the first protective film 23a and the second protective film 23b as in the above-described imaging device 10a in the modified example shown in FIG. 1B.

In the imaging device 10a, an aluminum oxide film (AlOx film) is deposited to a thickness of 30 nm by, for example, an atomic layer deposition process at a substrate temperature of 100° C. to 200° C. to form the second protective film 23b on the surface 14a of the insulating layer 14 so as to cover the counter electrode 20.

The substrate temperature as used herein refers to a temperature in the course of manufacture in which the film deposition up to the formation of the counter electrode 20 has been finished.

Next, the silicon oxynitride film (SiON film) is deposited to a thickness of 300 nm by, for example, a plasma CVD process at a substrate temperature of 150° C. to 250° C. to form the first protective film 23a on the second protective film 23b. The substrate temperature as used herein refers to a temperature in the course of manufacture in which the film deposition up to the formation of the second protective film 23b has been finished.

In the second protective film 23b, the internal stress of the aluminum oxide film (AlOx film) is preferably less than −200 MPa or more than 100 MPa. The second protective film 23b is formed by, for example, preliminarily investigating the relationships on the internal stress of the second protective film 23b between the film composition, the internal stress and the film forming conditions and depositing to a thickness of 50 nm or less, for example, 1 to 50 nm under such film forming conditions that the internal stress falls within the above-described range.

The first protective film 23a can be formed in the same manner as the above-described protective film 22, so the detailed description will be omitted.

The first protective film 23a and the second protective film 23b are formed by setting the thicknesses of the respective films so that the protective film 23 has a total thickness of 30 to 500 nm.

In the case of forming the protective film 23 of a two-layer structure, the second protective film 23b formed, for example, by an atomic layer deposition process at a substrate temperature of 100° C. to 200° C. as described above may be a thin film having a constant internal stress.

By forming the first protective film 23a, for example, at a substrate temperature of 150° C. to 250° C. using a plasma CVD process, the film obtained may have a stress in a broad range extending from a tensile stress including zero (positive stress) to a compressive stress (negative stress) in terms of internal stress. Accordingly, combinations of the thickness and internal stress of the first protective film 23a with the thickness and internal stress of the second protective film 23b which allow the protective film 23 to have a predetermined degree of internal stress are determined in advance. Then, film forming conditions (e.g., substrate temperature, electric power during film formation, gas type and gas mixing ratio) which allow the first protective film 23a and the second protective film 23b to each have a predetermined degree of internal stress are determined in advance. The protective film 23 of a single layer structure or a two-layer structure can be formed under such film forming conditions that the internal stress of the protective film 23 satisfies (1) to (3) as described above.

Next, the photoelectric conversion layer 50 and the electron blocking layer 52 constituting the organic layer 18 will be described in more detail.

The photoelectric conversion layer 50 contains a p-type organic semiconductor material and an n-type organic semiconductor material. Exciton dissociation efficiency can be increased by forming a donor-acceptor interface through junction of the p-type organic semiconductor material and the n-type organic semiconductor material. Therefore, the photoelectric conversion layer having a constitution in which the p-type organic semiconductor material is joined to the n-type organic semiconductor material achieves high photoelectric conversion efficiency. Particularly, the photoelectric conversion layer in which the p-type organic semiconductor material is mixed with the n-type organic semiconductor material is preferable because the junction interface is enlarged to improve the photoelectric conversion efficiency.

The p-type organic semiconductor material (compound) is a donor-type organic semiconductor material (compound). This material is mainly typified by a hole-transporting organic compound and refers to an organic compound having electron-donating properties. More specifically, when two organic materials are used in contact with each other, an organic compound having a smaller ionization potential is called the p-type organic semiconductor material. Therefore, any organic compound can be used as the donor-type organic compound if it is an electron-donating organic compound. For example, it is possible to use triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), metal complexes each having a nitrogen-containing heterocyclic compound as a ligand, and the like. The donor-type organic compound is not limited thereto, and as described above, any of organic compounds having a smaller ionization potential than organic compounds used as n-type (acceptor-type) compounds may be used as the donor-type organic semiconductor.

The n-type organic semiconductor material (compound) is an acceptor-type organic semiconductor material. This material is mainly typified by an electron-transporting organic compound and refers to an organic compound having electron-accepting properties. More specifically, when two organic compounds are used in contact with each other, an organic compound having a larger electron affinity is called the n-type organic semiconductor. Therefore, any organic compound can be used as the acceptor-type organic compound if it is an electron-accepting organic compound. Preferred examples include condensed aromatic carbocyclic compounds (naphthalene derivatives, anthracene derivatives, phenanthrene derivatives, tetracene derivatives, pyrene derivatives, perylene derivatives, fluoranthene derivatives), 5- to 7-membered heterocyclic compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, tribenzazepine), polyarylene compounds, fluorene compounds, cyclopentadiene compounds, silyl compounds, and metal complexes each having a nitrogen-containing heterocyclic compound as a ligand. The acceptor-type organic compound is not limited thereto, and as described above, any of organic compounds having a larger electron affinity than organic compounds used as p-type (donor-type) compounds may be used as the acceptor-type organic semiconductor.

As the p-type organic semiconductor material or the n-type organic semiconductor material, any organic dye may be used. However, preferable examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, Spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic carbocyclic dyes (naphthalene derivatives, anthracene derivatives, phenanthrene derivatives, tetracene derivatives, pyrene derivatives, perylene derivatives, and fluoranthene derivatives).

As the n-type organic semiconductor material, it is particularly preferable to use a fullerene or a fullerene derivative having excellent electron transport properties. Fullerenes include fullerene $C_{60}$, fullerene $C_{70}$, fullerene $C_{76}$, fullerene $C_{78}$, fullerene $C_{80}$, fullerene $C_{H}$, fullerene $C_{84}$, fullerene $C_{90}$, fullerene $C_{96}$, fullerene $C_{240}$, fullerene $C_{540}$, mixed fullerenes and fullerene nanotubes, and fullerene derivatives refer to compounds obtained by adding a substituent to these fullerenes.

As the substituent of the fullerene derivatives, alkyl groups, aryl groups, or heterocyclic groups are preferable. As the alkyl groups, alkyl groups having 1 to 12 carbon atoms are more preferable. As the aryl and heterocyclic groups, benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, benzimidazole ring, imidazopyridine ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring, or phenazine ring is preferable, benzene ring, naphthalene ring, anthracene ring, phenanthrene ring, pyridine ring, imidazole ring, oxazole ring, or thiazole ring is more preferable, and benzene ring, naphthalene ring, or pyridine ring is particularly preferable. These may further contain a substituent, and the substituent may bind to form a ring if possible. Moreover, the above substituents may have plural substituents which may be the same as or different from each other. These substituents may bind to form a ring if possible.

If the photoelectric conversion layer contains a fullerene or a fullerene derivative, electrons generated by photoelectric conversion can be rapidly transported to the pixel electrodes 16 or the counter electrode 20 via fullerene molecules or fullerene derivative molecules. If the fullerene molecules or fullerene derivative molecules line up and form the pathway of electrons in this state, electron transport properties are improved, whereby high-speed responsiveness of the photoelectric conversion element can be realized. In order to achieve the above improvement, it is preferable for the photoelectric conversion layer to contain a fullerene or a fullerene derivative in an amount of at least 40% (volume ratio). However, if the amount of the fullerene or the fullerene derivative is too large, the amount of the p-type organic semiconductor is reduced and the junction interface becomes smaller, whereby the exciton dissociation efficiency is reduced.

It is particularly preferable to use a triarylamine compound disclosed in JP 4213832 B and the like, as the p-type organic semiconductor material to be mixed with a fullerene or a fullerene derivative in the photoelectric conversion layer 50, because a high SN ratio of the photoelectric conversion element can be realized. If the ratio of the fullerene or the fullerene derivative in the photoelectric conversion layer is too high, the ratio of the triarylamine compound is reduced, and the amount of absorbed incident light decreases. Since the photoelectric conversion efficiency is thus reduced, it is preferable for the ratio of the fullerene or the fullerene derivative contained in the photoelectric conversion layer to be up to 85% (volume ratio).

Electron-donating organic materials can be used for the electron blocking layer 52. Specifically, as low-molecular weight materials, it is possible to use aromatic diamine compounds such as N,N-bis(3-methylphenyl)-(1,1'-biphenyl)-4, 4'-diamine (TPD) and 4,4'-bis[N-(naphthyl)-N-phenylamino]biphenyl (α-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphyrin compounds such as porphine, tetraphenylporphine copper, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, silazane derivatives, carbazole derivatives, bifluorene derivatives, and the like. As high-molecular weight materials, it is possible to use polymers such as phenylene vinylene, fluorene, carbazole, indole, pyrene, pyrrole, picoline, thiophene, acetylene, diacetylene and derivatives thereof. Compounds that are not electron-donating compounds can also be used as long as they have sufficient hole transport properties.

Inorganic materials may also be used for the electron blocking layer 52. Generally, inorganic materials have a higher dielectric constant than organic materials. Accordingly, when inorganic materials are used for the electron blocking layer 52, higher voltage is applied to the photoelectric conversion layer, hence the photoelectric conversion efficiency can be improved. Exemplary materials that may be used to form the electron blocking layer 52 include calcium oxide, chromium oxide, copper-chromium oxide, manganese oxide, cobalt oxide, nickel oxide, copper oxide, copper-gallium oxide, copper-strontium oxide, niobium oxide, molybdenum oxide, copper-indium oxide, silver-indium oxide, and iridium oxide.

In the electron blocking layer composed of a plurality of sublayers, one of the sublayers contacting the photoelectric conversion layer 50 is preferably made of the same material as the p-type organic semiconductor contained in the photoelectric conversion layer 50. By thus using the same p-type organic semiconductor also in the electron blocking layer 52, formation of an intermediate band at the interface between the photoelectric conversion layer 50 and its adjacent sublayer of the electron blocking layer is suppressed and dark current can be further suppressed.

In the electron blocking layer 52 of a single layer structure, this layer may be an inorganic material layer, and in the electron blocking layer 52 of a multi-layer structure, one or more than one sublayer of the electron blocking layer may be made of an inorganic material.

Next, a second embodiment of the invention will be described.

Figure 9A:
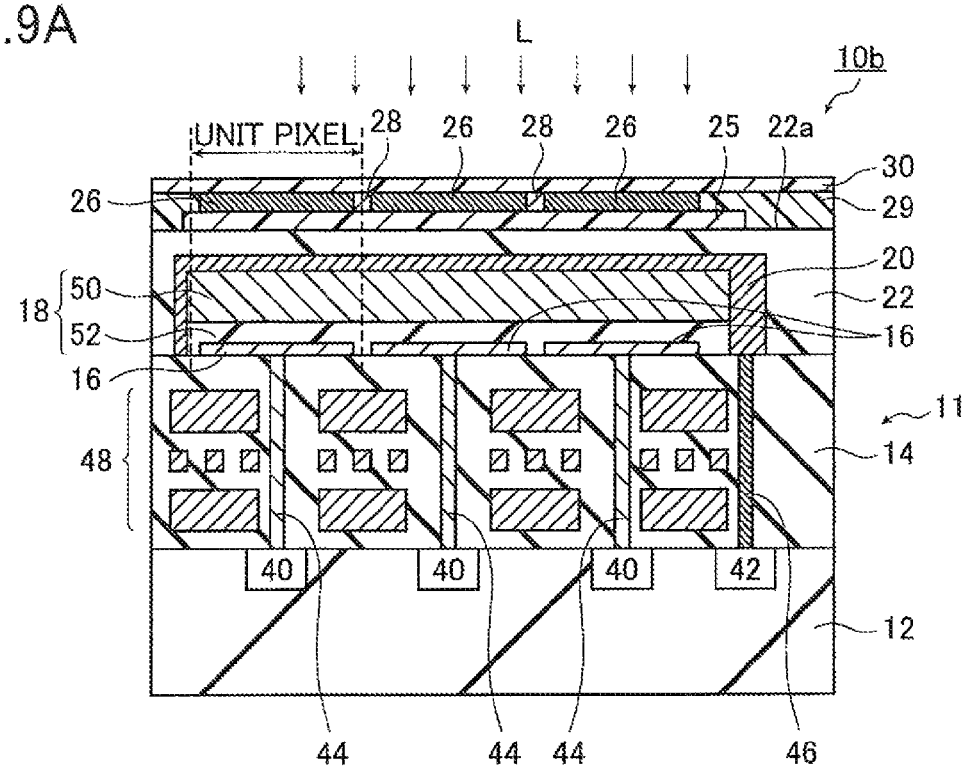
FIG. 9A is a schematic cross-sectional view showing an imaging device according to a second embodiment of the invention.
Figure 9B:
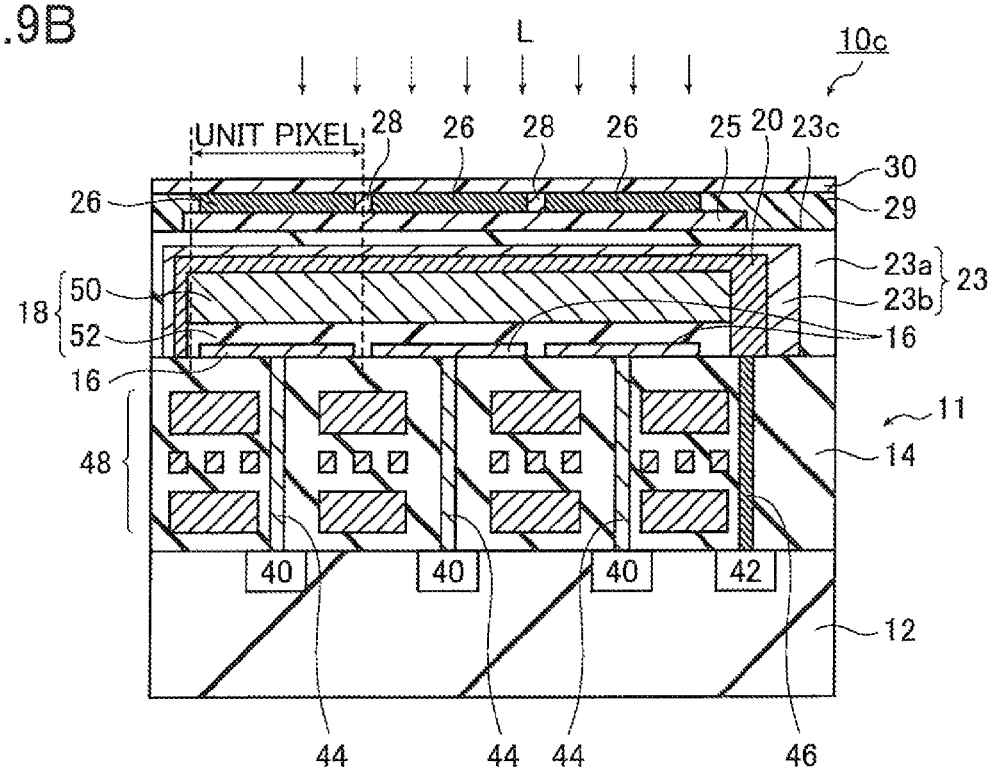
FIG. 9B is a schematic cross-sectional view showing a modified example of the imaging device according to the second embodiment of the invention.

FIG. 9A is a schematic cross-sectional view showing an imaging device according to the second embodiment of the invention; and FIG. 9B is a schematic cross-sectional view showing a modified example of the imaging device according to the second embodiment of the invention.

In the following description of the second embodiment, those structural elements which are identical to those of the imaging device shown in FIGS. 1A and 1B are identified by like numerals or symbols and will not be described in detail.

An imaging device 10b according to the embodiment under consideration differs from the imaging device 10 according to the first embodiment (see FIG. 1A) in that an organic thin film 25 is provided between a protective film 22 on the one hand and color filters 26 and partitions 28 on the other. The imaging device 10b also differs from the imaging device 10 in that a light shielding layer 29 is provided on the organic thin film 25 except the area (pixel effective area) where the color filters 26 and the partitions 28 are formed. Apart from these points, the imaging device 10b is configured in the same manner as the imaging device 10 according to the first embodiment (see FIG. 1A), so its detailed description will be omitted.

In such a situation that the protective film 22 has a defect such as a hole and there is a portion where the adhesion between a counter electrode 20 and a photoelectric conversion layer 50 is not sufficient, the organic thin film 25 is used to prevent a chemical agent such as an organic solvent or an alkali solution that may be used in the manufacture of the color filters 26 by a photolithographic process from passing through the hole and further passing through the portion where the adhesion between the counter electrode 20 and the photoelectric conversion layer 50 is not sufficient to penetrate the photoelectric conversion layer 50. The organic thin film 25 is formed on a surface 22a of the protective film 22 over a broader area than the photoelectric conversion layer 50.

Figure 10A:
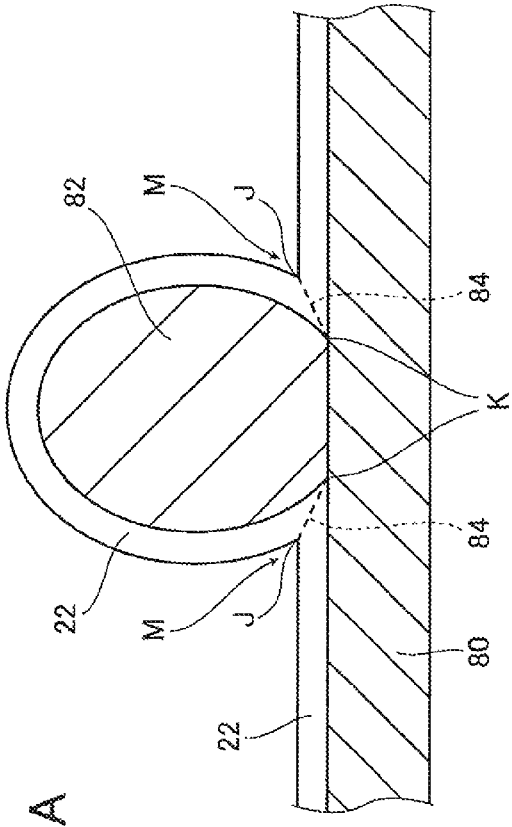
FIG. 10A is a schematic cross-sectional view in the observation of a cross-sectional transmission electron micrograph (TEM) for illustrating occurrence of a defect such as a hole in a protective film.

The defect such as a hole of the protective film 22 is more likely to occur on the periphery of a foreign object having adhered before the formation of the protective film 22. This is because, as shown in FIG. 10A, according to the observation of the periphery of a foreign object 82 having adhered to a base 80 by cross-sectional TEM (transmission electron microscopy), a crack or other defect may occur and the film density is more likely to decrease in the protective film 22 at an area of a straight line 84 connecting an inflection point J with a lower end K of the foreign object where J denotes the inflection point in a formation area of the protective film 22 on the periphery of the foreign object 82 and K denotes the lower end of the foreign object.

The organic thin film 25 is preferably formed over the area of a low-density portion M of the protective film 22 by a film forming method having good coverage.

Figure 10B:
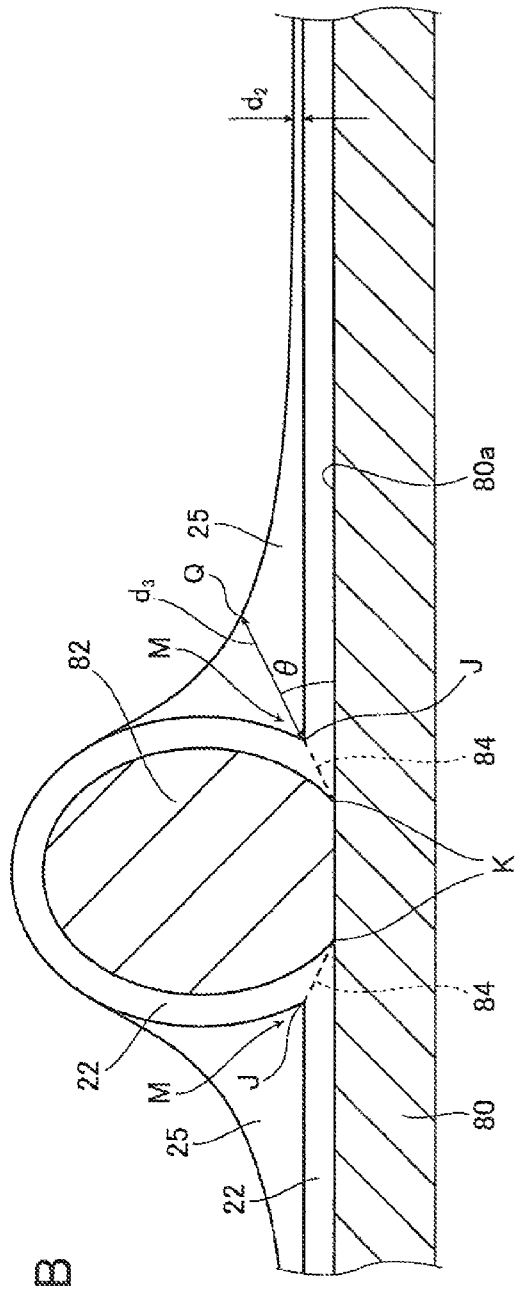
FIG. 10B is a schematic cross-sectional view in the observation of a cross-sectional TEM for illustrating effects of an organic thin film.

More specifically, as shown in FIG. 10B, $d_3$ is defined as a length from the inflection point J to a point of intersection Q between an extended line of the straight line 84 beyond the inflection point J and a surface of the organic thin film 25 and is used as an indicator of good coverage of the organic thin film 25 over the low-density portion M of the protective film 22.

$d_3$ is preferably thick with respect to $d_2/\sin\theta$ ($d_2$ is the thickness of flat portion of organic thin film).

$\theta$ refers to an angle formed between the straight line 84 and a flat surface 80a of the base 80.

$d_3 \geq (d_2/\sin\theta) \times 1.2$ is preferably satisfied, $d_3 \geq (d_2/\sin\theta) \times 1.5$ is more preferably satisfied, and $d_3 \geq (d_2/\sin\theta) \times 2.0$ is even more preferably satisfied. As a result, a chemical agent such as an organic solvent or an alkali solution can be effectively prevented from penetrating the base 80 from the periphery of the foreign object 82. The base 80 corresponds to the photoelectric conversion layer 50.

As a film deposition process for forming the above-described cross-sectional shape shown in FIG. 10B, the organic thin film 25 is preferably formed by wet coating such as spin coating or spray coating. Once the organic thin film is thus formed by wet coating, the defect of the protective film 22 can be suitably covered to protect the photoelectric conversion layer 50 from an organic solvent and a developer which may further adversely affect in the subsequent process.

For instance, CT-4000L manufactured by FUJIFILM Electronic Materials Co., Ltd. may be used as the coating solution.

As for the coating solution, use may be made of a solution of an organic polymer material, a dispersion of inorganic fine particles in an organic polymer material solution, a solution of an organic low-molecular compound and an organic polymer material in a single solvent, a dispersion of organic compound fine particles in an organic polymer material solution, and a solution of a liquid crystal and an organic polymer material in a single solvent. In the organic polymer material, the specific free volume, i.e., the ratio of the volume in a portion having no molecular chain to the volume of the whole polymer is preferably small. Penetration of a chemical agent into the photoelectric conversion layer 50 can be further prevented by selecting such an organic polymer material.

The specific free volume is preferably up to 25%, more preferably up to 20% and even more preferably up to 15%.

Exemplary solvents that may be used include alcohols, polyols, esters, ketones, ethers, cyclic ethers, halogenated hydrocarbons, aromatic hydrocarbons, aliphatic hydrocarbons, cyclic amides, non-cyclic amides, urea derivatives, carbonate esters, nitriles, nitrogen-containing heterocyclic compounds, amines, water, nitromethane, carbon disulfide, and sulfolane. Of these, a solvent which does not easily dissolve the photoelectric conversion layer 50 is preferably used in order to prevent film peeling. For instance, esters, ketones, ethers, aromatic hydrocarbons, sulfoxides, carbonate esters, nitrogen-containing heterocyclic compounds and amines are preferred and alcohols, polyols, aliphatic hydrocarbons, urea derivatives and nitriles are more preferred.

In a case where the organic thin film 25 is formed by a wet coating process, the solvent remains at least on the order of ppm and it is preferable to sufficiently bake the organic thin film 25 during its formation so that the residual solvent may be vaporized as much as possible.

Since wet coating uses a solvent for dissolving an organic polymer material or the like, wet coating can be distinguished from dry film formation (e.g., physical vapor deposition) by detecting a solvent remaining in the organic thin film 25. An organic thin film formed by wet coating can be distinguished from an organic thin film formed by dry film formation by further evaluating the cross-sectional shapes shown in FIGS. 10A and 10B as described above.

It is also necessary for the organic thin film 25 to have chemical resistance and particularly to be insoluble in an alkali solution. To be more specific, in a case where the organic thin film 25 is immersed for 10 minutes in a 2.38% aqueous solution of tetramethylammonium hydroxide (TMAH) commonly used in the manufacture of the color filters 26, the rate of film thickness reduction is preferably up to 20%. The reduction rate is more preferably up to 10%, and even more preferably up to 5%. The alkali solution can be prevented from penetrating the photoelectric conversion layer 50 by adjusting the reduction rate in the foregoing range. For instance, the organic thin film 25 preferably has a thickness of at least 10 nm. The thickness is more preferably at least 20 nm and even more preferably at least 30 nm. If the thickness of the organic thin film 25 is within the foregoing range, the periphery of the foreign object can be suitably covered with the organic thin film 25 and a chemical agent used in the manufacture of the color filters 26 by a photolithographic process can be prevented from penetrating the photoelectric conversion layer 50. In terms of suppressing color mixing, the thickness of the organic thin film 25 is preferably up to 200 nm, more preferably up to 150 nm, and even more preferably up to 100 nm.

In order to increase the photoelectric conversion efficiency in the organic photoelectric conversion layer, the organic thin film 25 is preferably sufficiently transparent to visible light. The organic thin film 25 preferably has a transmittance of at least 50%, more preferably at least 65%, and even more preferably at least 80%.

The imaging device 10b in the embodiment under consideration can achieve the same effects as the imaging device 10 in the first embodiment.

As in the first embodiment, the protective film 22 according to this embodiment is also of a single layer structure but is not limited to this structure. For instance, the protective film 22 may be of a two-layer structure as in a protective film 23 of an imaging device 10c shown in FIG. 9B including, for example, a first protective film 23a and a second protective film 23b.

The imaging device 10c shown in FIG. 9B only differs from the imaging device 10a shown in FIG. 1B in that the above-described organic thin film 25 is formed on a surface 23c of the first protective film 23a of the protective film 23; the other structural elements are identical to their counterparts and will not be described in detail.

The method for manufacturing the imaging device 10b in the embodiment under consideration has the same steps as the method for manufacturing the imaging device 10 in the first embodiment except that the organic thin film 25 is formed on the surface 22a of the protective film 22, so its detailed description will be omitted.

Figure 11:
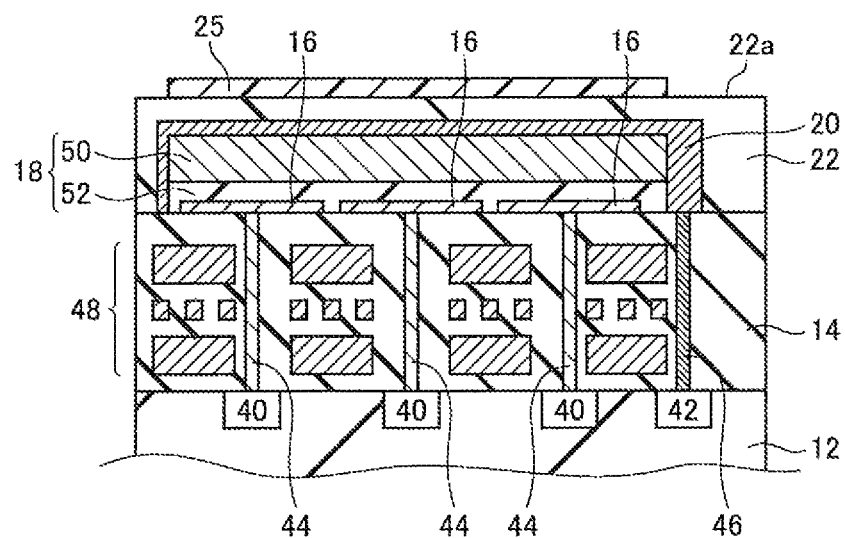
FIG. 11 is a schematic cross-sectional view showing a method for manufacturing the imaging device according to the second embodiment of the present invention.

The manufacturing method in the embodiment under consideration is the same as the method for manufacturing the imaging device 10 in the first embodiment up to the steps shown in FIGS. 7A to 7C, 8A and 8B. Thereafter, as shown in FIG. 11, the organic thin film 25 is formed on the surface 22a of the protective film 22 over a broader area than the photoelectric conversion layer 50 by, for example, a wet coating process.

Then, as in the first embodiment, the color filters 26 and the partitions 28 are formed on the organic thin film 25, and the light shielding layer 29 on the surface 22a of the protective film 22 by, for example, a photolithographic process.

Then, the overcoat layer 30 is formed by, for example, a coating process so as to cover the color filters 26, the partitions 28, and the light shielding layer 29. In this manner, the imaging device 10b shown in FIG. 9A can be formed.

In the embodiment under consideration, even if the protective film 22 has a defect such as a hole, formation of the organic thin film 25 contributes to preventing a chemical agent such as a solvent that may be used in the formation of the color filters 26, the partitions 28 and the light shielding layer 29 by, for example, a photolithographic process from penetrating the photoelectric conversion layer 50. Peeling of the protective film 22 can be thus suppressed while improving the yield of the imaging device 10b.

The present invention is basically configured as described above. While the imaging device of the present invention has been described above in detail, the present invention is by no means limited to the above embodiments, and various improvements and modifications may of course be made without departing from the spirit of the present invention.

First Example

The effects of the protective films of the present invention will be described more specifically below.

In First Example, samples of Examples 1 to 4 and Comparative Examples 1 to 7 were prepared to confirm the effects of the protective films of the present invention.

In First Example, simply configured photoelectric conversion element bodies each of which included pixel electrodes formed on a part of a surface of a substrate, an organic layer formed on the substrate as a photoelectric conversion layer so as to cover the pixel electrodes, a counter electrode formed on the organic layer, and a protective film formed so as to cover the counter electrode were used as the samples.

A protective film of a single layer structure or a protective film of a two-layer structure including a second protective film (lower protective film) and a first protective film (upper protective film) was used as the protective film.

Element units having the same configuration except the structure of the protective film were used in the samples in Examples 1 to 4 and Comparative Examples 1 to 7.

An element unit formed by the procedure described below was prepared for each sample.

An alkali-free glass substrate with a thickness of 0.7 mm was prepared as a substrate and indium tin oxide (ITO) film with a thickness of 100 nm was formed by a sputtering process on the substrate so as to serve as pixel electrodes.

Then, a material represented by chemical formula 1 below (fullerene $C_{60}$ and a material represented by chemical formula 2 below were codeposited onto the substrate at deposition rates of 16 to 18 nm/s and 25 to 28 nm/s, respectively, so that the volume ratio between the material represented by chemical formula 1 and the material represented by chemical formula 2 was 1:3, whereby an organic layer (photoelectric conversion layer) with a thickness of 400 nm was formed so as to cover the pixel electrodes. The organic layer did not have an electron blocking layer.

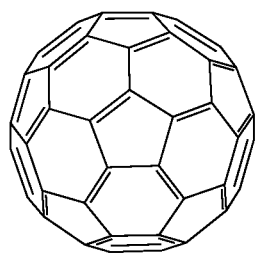

(Chemical formula 1)

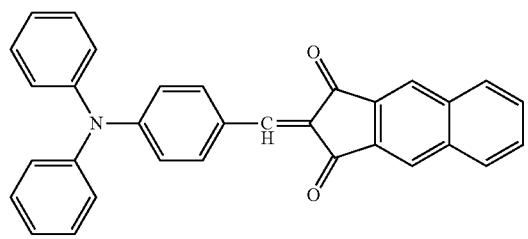

(Chemical formula 2)

Next, an indium tin oxide (ITO) film with a thickness of 10 nm was formed as a counter electrode by a sputtering process on the organic layer and the substrate so as to cover the organic layer.

The sample in Example 1 was formed as follows:

A silicon oxynitride film (SiON film) with a thickness of 300 nm was formed as a protective film on the counter electrode and the substrate by a plasma CVD process so as to cover the counter electrode of the element unit prepared as above.

The sample in Example 1 was thus prepared.

In the sample of Example 2 in which the protective film was of a two-layer structure, an aluminum oxide ($AlO_x$) film with a thickness of 30 nm was formed as a second protective film on the element unit by an ALCVD process (atomic layer deposition process) and an SiON film with a thickness of 300 nm was then formed as a first protective film by a plasma CVD process as in Example 1. The sample in Example 2 was thus prepared.

Example 1 was repeated except that the composition, structure and thickness of the protective films, and the manufacturing method were changed as shown in Table 1, thereby preparing the samples of Examples 3 to 4 and Comparative Examples 1 to 7.

The composition and the structure of the protective films in the samples of Examples 1 to 4 and Comparative Examples 1 to 7 are as shown in Table 1. In Table 1, the column of "Structure" in each of "First protective film (upper protective film)" and "Second protective film (lower protective film)" also includes the film thickness and the manufacturing method.

The first protective film and the second protective film were obtained by preliminarily determining the film forming conditions (e.g., film forming temperature, electric power during film formation, gas type and gas mixing ratio) so that a predetermined degree of internal stress was reached, and depositing under the manufacturing conditions.

ALCVD (atomic layer chemical vapor deposition) shown in Table 1 refers to an atomic layer deposition process and ion plating shown in Table 1 refers to an ion plating process.

The stresses of the first protective film and the second protective film as shown in Table 1 were obtained by forming the first protective film and the second protective film on a silicon wafer and calculating the stresses by the same calculation method as used for the above-mentioned thin film 72 by using the above-mentioned measurement apparatus 200 shown in FIG. 6.

In the case of a two-layer structure, the stress in the whole of the protective film was obtained by forming the first protective film and the second protective film on a silicon wafer and calculating the stress by the same calculation method as used for the foregoing thin film 72 by using the foregoing measurement apparatus 200 shown in FIG. 6. In the case of a single layer structure, the stress in the whole of the protective film is the stress of the first protective film or the stress of the second protective film in a state in which the first protective film or the second protective film is formed on a silicon wafer as a single layer as described above.

In First Example, each of the samples in Examples 1 to 4 and Comparative Examples 1 to 7 was immersed in acetone for 30 seconds and the state of the protective film was observed using an optical microscope (at a magnification of 5×). The results are shown in the column of "Immersion test result" in Table 1.

In the immersion test results, a protective film having no change between before and after the immersion was indicated by "No change," and a protective film, a part of which came off was indicated by "Film-peeled." In addition, a protective film, in a part of which wrinkles occurred between before and after the immersion was indicated by "Wrinkled." A protective film which was widely wrinkled was indicated by "Widely wrinkled." In addition, a protective film, in a part of which cracks occurred between before and after the immersion was indicated by "Cracked."

TABLE 1

| | Second protective film (lower protective film) | | First protective film (upper protective film) | | Stress of whole protective film | Total thickness of whole protective film (nm) | Immersion test result |
| --- | --- | --- | --- | --- | --- | --- | --- |
| | Structure | Stress (MPa) | Structure | Stress (MPa) | (MPa) | | |
| Example 1 | — | — | SiON(300 nm: plasma CVD) | −50 | −50 | 300 | No change |

TABLE 1-continued

| | Second protective film (lower protective film) | | First protective film (upper protective film) | | Stress of whole protective film (MPa) | Total thickness of whole protective film (nm) | Immersion test result |
|---|---|---|---|---|---|---|---|
| | Structure | Stress (MPa) | Structure | Stress (MPa) | | | |
| Example 2 | AlOx (30 nm: ALCVD) | +450 | SiON(300 nm: plasma CVD) | −50 | −5 | 330 | No change |
| Example 3 | — | — | SiN(300 nm: plasma CVD) | +50 | +50 | 300 | No change |
| Example 4 | AlOx (30 nm: ALCVD) | +450 | SiON(300 nm: ion plating) | −150 | −95 | 330 | No change |
| Comparative Example 1 | AlOx (200 nm: ALCVD) | +450 | — | — | +450 | 200 | Film-peeled |
| Comparative Example 2 | AlOx (200 nm: ALCVD) | +450 | SiON(100 nm: sputtering) | −450 | +150 | 300 | Film-peeled |
| Comparative Example 3 | — | — | SiON(100 nm: sputtering) | −450 | −450 | 100 | Wrinkled |
| Comparative Example 4 | AlOx (30 nm: ALCVD) | +450 | SiON(100 nm: sputtering) | −450 | −240 | 130 | Wrinkled |
| Comparative Example 5 | — | — | SiON(100 nm: ion plating) | −900 | −900 | 100 | Widely wrinkled |
| Comparative Example 6 | — | — | SiN(300 nm: plasma CVD) | +200 | +200 | 300 | Film-peeled |
| Comparative Example 7 | — | — | SiON(300 nm: ion plating) | −300 | −300 | 300 | Wrinkled |

As shown in Table 1, in Examples 1 to 4 satisfying expression (2) relating to the internal stress value in the single layer structure and the thickness of the second protective film, there was no change in the protective film and good results could be obtained.

On the other hand, in Comparative Example 1 having a large tensile stress as the internal stress, film peeling occurred.

In Comparative Example 2, the second protective film has a thickness twice as large as that of the first protective film and a tensile force acts internally as a whole of the protective film. Therefore, film peeling occurred in Comparative Example 2.

In Comparative Examples 3, 5 and 7, the compressive stress was large and wrinkles occurred. In particular, in Comparative Example 5 in which the compressive force was large, wrinkles occurred in a wide area.

In Comparative Example 4, the first protective film has a thickness about three times as large as that of the second protective film and a compressive force acts as the internal stress in the whole of the protective film. Therefore, wrinkles occurred in Comparative Example 4.

In Comparative Example 6, film peeling occurred due to a large tensile stress.

Second Example

In Second Example, samples of Examples 10 to 13 and Comparative Examples 10 to 13 were prepared to confirm the effects of the protective films of a single layer structure.

The samples in Examples 10 to 13 and Comparative Examples 10 to 13 are configured in the same manner as Example 1 of First Example except that the protective film is of a single layer structure and only includes a first protective film and the film thickness is different, so their detailed description will be omitted. Methods for manufacturing the samples in Examples 10 to 13 and Comparative Examples 10 to 13 are also the same as the manufacturing method in Example 1 of First Example except for the thickness of the protective film, so their detailed description will be omitted. In Table 2 below, the thickness of the protective film and the manufacturing method are also shown.

The first protective film is a silicon oxynitride (SiON) film obtained by preliminarily determining the film forming conditions (e.g., film forming temperature, electric power during film formation, gas type and gas mixing ratio) so that a predetermined degree of internal stress is reached, and depositing under the manufacturing conditions.

The stress of the first protective film, the stress of the second protective film and the stress of the whole of the protective film were measured by the same method as used in First Example. Accordingly, the detailed description will be omitted.

In Second Example, as in First Example, each of the samples in Examples 10 to 13 and Comparative Examples 10 to 13 was immersed in acetone for 30 seconds and the state of the protective film was observed using an optical microscope (at a magnification of 5×). The results are shown in the column of "Immersion test result" in Table 2. The same evaluation criteria as in First Example were used. Accordingly, the detailed description will be omitted.

TABLE 2

| | Second protective film (lower protective film) | | First protective film (upper protective film) | | Stress of whole protective film (MPa) | Total thickness of whole protective film (nm) | Immersion test result |
|---|---|---|---|---|---|---|---|
| | Structure | Stress (MPa) | Structure | Stress (MPa) | | | |
| Example 10 | — | — | SiON(30 nm: plasma CVD) | −26 | −26 | 30 | No change |
| Example 11 | — | — | SiON(500 nm: plasma CVD) | −26 | −26 | 500 | No change |

TABLE 2-continued

| | Second protective film (lower protective film) | | First protective film (upper protective film) | | Stress of whole protective film (MPa) | Total thickness of whole protective film (nm) | Immersion test result |
|---|---|---|---|---|---|---|---|
| | Structure | Stress (MPa) | Structure | Stress (MPa) | | | |
| Example 12 | — | — | SiON(30 nm: plasma CVD) | +46 | +46 | 30 | No change |
| Example 13 | — | — | SiON(500 nm: plasma CVD) | +46 | +46 | 500 | No change |
| Comparative Example 10 | — | — | SiON(30 nm: plasma CVD) | −52 | −52 | 30 | Wrinkled |
| Comparative Example 11 | — | — | SiON(500 nm: plasma CVD) | −52 | −52 | 500 | Wrinkled |
| Comparative Example 12 | — | — | SiON(30 nm: plasma CVD) | +69 | +69 | 30 | Cracked |
| Comparative Example 13 | — | — | SiON(500 nm: plasma CVD) | +69 | +69 | 500 | Cracked |

As shown in Table 2, in Examples 10 to 13 in which the protective film was of a single layer structure and the internal stress was in the defined range, there was no change in the protective film and good results could be obtained.

On the other hand, in Comparative Examples 10 and 11 in which the compressive stress was large, wrinkles occurred in the protective film. Moreover, in Comparative Examples 12 and 13 in which the tensile stress was large, cracks occurred in the protective film.

Third Example

In Third Example, samples of Examples 20, 21 and 30 to 33, and Comparative examples 20 to 25 and 30 to 33 were prepared to confirm the effects of the protective films of a laminated structure in which the second protective film was thinner than the first protective film.

In Third Example, the effects of the protective films are confirmed by changing the thickness of the second protective film. In Examples 20 and 21 and Comparative Examples 20 to 25, the second protective film has a thickness of more than 0 nm but up to 15 nm, and in Examples 30 to 33 and Comparative Examples 30 to 33, the second protective film has a thickness of more than 15 nm but up to 50 nm.

The samples in Examples 20, 21 and 30 to 33 and Comparative Examples 20 to 25 and 30 to 33 are configured in the same manner as Example 1 of First Example except that the protective film is of a two-layer structure, so their detailed description will be omitted. Methods for manufacturing the samples in Examples 20, 21 and 30 to 33 and Comparative Examples 20 to 25 and 30 to 33 differ from the manufacturing method in Example 1 of First Example as to how to manufacture the protective films.

In Third Example, Example 1 as mentioned above was repeated except that a protective film of which the thickness and the manufacturing method are shown in the columns of "Structures" of "First protective film (upper protective film)" and "Second protective film (lower protective film)" in Tables 3 and 4 was formed on the element unit in First Example as mentioned above, thereby preparing the samples in Examples 20, 21 and 30 to 33 and Comparative Examples 20 to 25 and 30 to 33.

Also in Third Example, the first protective film and the second protective film were obtained by preliminarily determining the film forming conditions (e.g., film forming temperature, electric power during film formation, gas type and gas mixing ratio) so that a predetermined degree of internal stress was reached, and depositing under the manufacturing conditions.

The stress of the first protective film, the stress of the second protective film and the stress of the whole of the protective film were measured by the same method as used in First Example. Accordingly, the detailed description will be omitted.

In Third Example, as in First Example, each of the samples in Examples 20, 21 and 30 to 33 and Comparative Examples 20 to 25 and 30 to 33 was immersed in acetone for 30 seconds and the state of the protective film was observed using an optical microscope (at a magnification of 5×). The results are shown in the column of "Immersion test result" in Tables 3 and 4. The same evaluation criteria as in First Example were used. Accordingly, the detailed description will be omitted.

TABLE 3

| | Second protective film (lower protective film) | | First protective film (upper protective film) | | Stress of whole protective film (MPa) | Total thickness of whole protective film (nm) | Immersion test result |
|---|---|---|---|---|---|---|---|
| | Structure | Stress (MPa) | Structure | Stress (MPa) | | | |
| Example 20 | AlOx (10 nm: ALCVD) | +450 | SiON(30 nm: plasma CVD) | −100 | +37 | 40 | No change |
| Example 21 | AlOx (10 nm: ALCVD) | +450 | SiON(30 nm: plasma CVD) | −266 | −87 | 40 | No change |
| Comparative Example 20 | AlOx (7 nm: ALCVD) | +450 | SiON(30 nm: plasma CVD) | −220 | −93 | 37 | Wrinkled |
| Comparative Example 21 | AlOx (7 nm: ALCVD) | +450 | SiON(300 nm: plasma CVD) | +46 | +55 | 307 | Cracked |
| Comparative Example 22 | AlOx (10 nm: ALCVD) | +450 | SiON(30 nm: plasma CVD) | −70 | +60 | 40 | Cracked |
| Comparative Example 23 | AlOx (10 nm: ALCVD) | +450 | SiON(100 nm: plasma CVD) | −168 | −112 | 110 | Wrinkled |

TABLE 3-continued

|  | Second protective film (lower protective film) | | First protective film (upper protective film) | | Stress of whole protective film (MPa) | Total thickness of whole protective film (nm) | Immersion test result |
|---|---|---|---|---|---|---|---|
|  | Structure | Stress (MPa) | Structure | Stress (MPa) |  |  |  |
| Comparative Example 24 | AlOx (13 nm: ALCVD) | +450 | SiON(100 nm: plasma CVD) | −198 | −123 | 113 | Wrinkled |
| Comparative Example 25 | AlOx (13 nm: ALCVD) | +450 | SiON(300 nm: plasma CVD) | +46 | +62 | 313 | Cracked |

TABLE 4

|  | Second protective film (lower protective film) | | First protective film (upper protective film) | | Stress of whole protective film (MPa) | Total thickness of whole protective film (nm) | Immersion test result |
|---|---|---|---|---|---|---|---|
|  | Structure | Stress (MPa) | Structure | Stress (MPa) |  |  |  |
| Example 30 | AlOx (30 nm: ALCVD) | +450 | SiON(300 nm: plasma CVD) | −52 | −6 | 330 | No change |
| Example 31 | AlOx (30 nm: ALCVD) | +450 | SiON(300 nm: plasma CVD) | −180 | −122 | 330 | No change |
| Example 32 | AlOx (50 nm: ALCVD) | +450 | SiON(300 nm: plasma CVD) | −94 | −16 | 350 | No change |
| Example 33 | AlOx (50 nm: ALCVD) | +450 | SiON(300 nm: plasma CVD) | −198 | −105 | 350 | No change |
| Comparative Example 30 | AlOx (30 nm: ALCVD) | +450 | SiON(300 nm: plasma CVD) | −9 | +33 | 330 | Cracked |
| Comparative Example 31 | AlOx (30 nm: ALCVD) | +450 | SiON(300 nm: plasma CVD) | −198 | −139 | 330 | Wrinkled |
| Comparative Example 32 | AlOx (50 nm: ALCVD) | +450 | SiON(100 nm: plasma CVD) | −202 | +15 | 150 | Cracked |
| Comparative Example 33 | AlOx (50 nm: ALCVD) | +450 | SiON(300 nm: plasma CVD) | −232 | −170 | 350 | Wrinkled |

As shown in Table 3, in Examples 20 and 21 in which the internal stress in the whole of the protective film satisfies the expression (1) mentioned above when the thickness of the second protective film is more than 0 nm but less than 15 nm, there was no change in the protective film and good results could be obtained.

On the other hand, as for Comparative Examples 20 to 25 in which the internal stress in the whole of the protective film does not satisfy the expression (1) mentioned above, cracks occurred in Comparative Examples 21, 22 and 25 showing a large tensile stress, whereas wrinkles occurred in Comparative Examples 20, 23 and 24 having a large compressive stress.

Also as shown in Table 4, in Examples 30 to 33 in which the internal stress in the whole of the protective film satisfies the expression (2) mentioned above when the thickness of the second protective film is at least 15 nm but up to 50 nm, there was no change in the protective film and good results could be obtained.

On the other hand, as for Comparative Examples 30 to 33 in which the internal stress in the whole of the protective film does not satisfy the expression (2) mentioned above, cracks occurred in Comparative Examples 30 and 32 showing a large tensile stress, whereas wrinkles occurred in Comparative Examples 31 and 33 having a large compressive stress.

Fourth Example

In Fourth Example, samples of Examples 40 to 43 and Comparative Examples 40 to 43 were prepared to confirm the effects of the protective films of a laminated structure in which the thickness of the second protective film is the same as or larger than that of the first protective film.

The samples in Examples 40 to 43 and Comparative Examples 40 to 43 are configured in the same manner as Example 1 of First Example except that the protective films are of a two-layer structure, so their detailed description will be omitted. Methods for manufacturing the samples in Examples 40 to 43 and Comparative Examples 40 to 43 differ from the manufacturing method in Example 1 of First Example as to how to manufacture the protective films.

In Fourth Example, Example 1 as mentioned above was repeated except that a protective film of which the thickness and the manufacturing method are shown in the columns of "Structures" of "First protective film (upper protective film)" and "Second protective film (lower protective film)" in Table 5 was formed on the element unit in First Example as mentioned above, thereby preparing the samples in Examples 40 to 43 and Comparative Examples 40 to 43.

The first protective film and the second protective film were obtained by preliminarily determining the film forming conditions (e.g., film forming temperature, electric power during film formation, gas type and gas mixing ratio) so that a predetermined degree of internal stress was reached, and depositing under the manufacturing conditions.

The stress of the first protective film, the stress of the second protective film and the stress of the whole of the protective film were measured by the same method as used in First Example. Accordingly, the detailed description will be omitted.

In Fourth Example, as in First Example, each of the samples in Examples 40 to 43 and Comparative Examples 40 to 43 was immersed in acetone for 30 seconds and the state of the protective film was observed using an optical microscope (at a magnification of 5×). The results are shown in the column of "Immersion test result" in Table 5. The same evaluation criteria as in First Example were used. Accordingly, the detailed description will be omitted.

TABLE 5

| | Second protective film (lower protective film) | | First protective film (upper protective film) | | Stress of whole protective film (MPa) | Total thickness of whole protective film (nm) | Immersion test result |
|---|---|---|---|---|---|---|---|
| | Structure | Stress (MPa) | Structure | Stress (MPa) | | | |
| Example 40 | AlOx (30 nm: ALCVD) | +450 | SiON(30 nm: plasma CVD) | −230 | +110 | 60 | No change |
| Example 41 | AlOx (30 nm: ALCVD) | +450 | SiON(30 nm: ion plating) | −400 | +25 | 60 | No change |
| Example 42 | AlOx (50 nm: ALCVD) | +450 | SiON(30 nm: ion plating) | −450 | +112 | 80 | No change |
| Example 43 | AlOx (50 nm: ALCVD) | +450 | SiON(30 nm: ion plating) | −720 | +11 | 80 | No change |
| Comparative Example 40 | AlOx (30 nm: ALCVD) | +450 | SiON(30 nm: plasma CVD) | −202 | +124 | 60 | Cracked |
| Comparative Example 41 | AlOx (50 nm: ALCVD) | +450 | SiON(30 nm: plasma CVD) | −330 | +157 | 80 | Cracked |
| Comparative Example 42 | AlOx (30 nm: ALCVD) | +450 | SiON(30 nm: ion plating) | −500 | −25 | 60 | Wrinkled |
| Comparative Example 43 | AlOx (50 nm: ALCVD) | +450 | SiON(50 nm: ion plating) | −800 | −19 | 80 | Wrinkled |

As shown in Table 5, in Examples 40 to 43 in which the internal stress of the whole of the protective film satisfies the expression (3) mentioned above, there was no change in the protective film and good results could be obtained.

On the other hand, as for Comparative Examples 40 to 43 in which the internal stress of the whole of the protective film does not satisfy the expression (3) mentioned above, cracks occurred in Comparative Examples 40 and 41 showing a large tensile stress, whereas wrinkles occurred in Comparative Examples 42 and 43 having a large compressive stress.

Fifth Example

The effects of the organic thin films of the present invention will be described more specifically below.

In Fifth Example, samples in Experimental Examples A and B in which an organic thin film was formed on a protective film by a wet coating process and samples in Experimental Examples C and D in which no organic thin film was formed on a protective film were prepared.

Each of the samples in Experimental Examples A to D has a protective film of a two-layer structure including a second protective film (lower protective film) and a first protective film (upper protective film) as shown in Table 6.

Each of the samples in Experimental Examples A to D is configured in the same manner as that of Example 1 of First Example as for the configuration below the organic thin film except that the protective film is of a two-layer structure and the structure of the organic layer is different, so their detailed description will be omitted. Methods for manufacturing the samples in Experimental Examples A to D differ from the manufacturing method in Example 1 of First Example as to how to manufacture the protective films and organic thin films.

In Fifth Example, each of the samples in Experimental Examples A to D was prepared as described below. A method for manufacturing a protective film of a two-layer structure, a method for forming an organic layer and a method for forming an organic thin film will be described later in detail.

In the method for manufacturing a protective film of a two-layer structure in each of the samples in Experimental Examples A to D, as shown in Table 6, an aluminum oxide (AlO$_x$) film with a thickness of 30 nm was formed as a second protective film on the above-described element unit in First Example by an ALCVD process (atomic layer deposition process) and an SiON film with a thickness of 100 nm or 300 nm was then formed as a first protective film by a plasma CVD process or a sputtering process.

In Table 6, the column of "Structure" in each of "First protective film (upper protective film)" and "Second protective film (lower protective film)" also includes the film thickness and the film manufacturing method.

The first protective film and the second protective film were obtained by preliminarily determining the film forming conditions (e.g., film forming temperature, electric power during film formation, gas type and gas mixing ratio) so that a predetermined degree of internal stress was reached, and depositing under the manufacturing conditions.

As for the samples in Experimental Examples A and B, the element unit in First Example in which the protective film of a two-layer structure had been formed as described above was used to form an organic thin film on the protective film to thereby prepare the samples in Experimental Examples A and B.

Experimental Example C has a configuration in which the organic thin film in Experimental Example B is not formed. A protective film of a two-layer structure was formed on the element unit in First Example as described above to thereby prepare the sample in Experimental Example C.

In Experimental Example D, a SiON film was formed in place of the organic thin film in Experimental Example B. The element unit in First Example in which the protective film of a two-layer structure had been formed as described above was used to form the SiON film with a thickness of 70 nm on the protective film by a plasma CVD process to thereby prepare the sample in Experimental Example D.

Fullerene $C_H$ represented by chemical formula 1 above and a material represented by chemical formula 3 below were codeposited at deposition rates of 16 to 18 nm/s and 25 to 28 nm/s, respectively, so that the volume ratio between the material represented by chemical formula 1 and the material represented by chemical formula 3 was 1:3, whereby an organic film with a thickness of 400 nm was formed.

(Chemical formula 3)

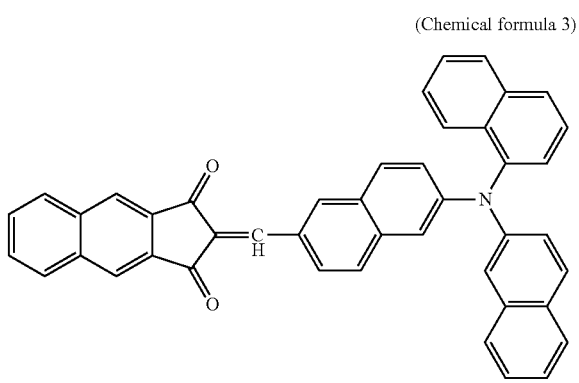 [SMILES: O=C1C(=Cc2ccc3cc(N(c4ccc5ccccc5c4)c4cccc5ccccc45)ccc3c2)C(=O)c2cc3ccccc3cc21]

The method for forming an organic thin film will now be described.

CT-4000L manufactured by FUJIFILM Electronic Materials Co., Ltd. was spin-coated to form the organic thin film. The rotational speed was set to 2,000 rpm and the time to 45 seconds. Thereafter, the thin film was baked at a temperature of 220° C. for 5 minutes. A flat portion of the organic thin film had a thickness of about 70 nm.

Subsequently, an R filter, a G filter and a B filter (color filters) were formed in each of the samples in Experimental Examples A and B in which the organic thin film was formed and the sample in Experimental Example C in which the organic thin film was not formed.

First, a resist for the R filter was applied by a spin coater and pre-baked; a portion corresponding to the R filter was then pattern-exposed with an i-line stepper (NSR-2205i12D manufactured by Nikon Corporation) and the resist was further developed with a developer (CD-2060 manufactured by FUJIFILM Electronic Materials Co., Ltd.) to remove portions shielded from light, which was followed by rinsing with water, drying and post-baking to form the R filter.

Moreover, the same treatment was performed for the G and B filters to form color filters composed of arranged R, G and B filters on the protective film.

COLOR MOSAIC-EXIS SR-4000L, SG-4000L, SB-4000L (manufactured by FUJIFILM Electronic Materials Co., Ltd.) were used as the resists for the R, G and B filters, respectively.

The stress of the first protective film, the stress of the second protective film and the stress of the organic thin film as shown in Table 6 were obtained by forming the first protective film, the second protective film and the organic thin film on a silicon wafer and calculating the stresses by the same calculation method as used for the above-mentioned thin film 72 by using the above-mentioned measurement apparatus 200 shown in FIG. 6.

The stress of the whole of the protective film was obtained by forming the second protective film and the first protective film on a silicon wafer and calculating the stress by the same calculation method as used for the above-mentioned thin film 72 by using the above-mentioned measurement apparatus 200 shown in FIG. 6.

In Fifth Example, as in First Example, each of the samples in Experimental Examples A to D was immersed in acetone for 30 seconds and the state of the protective film was observed using an optical microscope (at a magnification of 5×). The results are shown in the column of "Observation result" in Table 6. The same evaluation criteria as in First Example were used. Accordingly, the detailed description will be omitted.

TABLE 6

| | Second protective film (lower protective film) | | First protective film (upper protective film) | | Stress of whole protective film (MPa) | Total thickness of whole protective film (nm) | Organic thin film | | Presence of organic thin film | Observation result |
|---|---|---|---|---|---|---|---|---|---|---|
| | Structure | Stress (MPa) | Structure | Stress (MPa) | | | Structure | Stress (MPa) | | |
| Experimental Example A | AlOx (30 nm: ALCVD) | +450 | SiON(300 nm: plasma CVD) | −50 | −5 | 330 | Organic thin film (70 nm: wet coating) | +20 | Yes | No change |
| Experimental Example B | AlOx (30 nm: ALCVD) | +450 | SiON(100 nm: sputtering) | −450 | −242 | 130 | Organic thin film (70 nm: wet coating) | +20 | Yes | Wrinkled in a very small area |
| Experimental Example C | AlOx (30 nm: ALCVD) | +450 | SiON(100 nm: sputtering) | −450 | −242 | 130 | — | — | No | Wrinkled |
| Experimental Example D | AlOx (30 nm: ALCVD) | +450 | SiON(100 nm: sputtering) | −450 | −242 | 130 | SiON in place of organic thin film (70 nm: plasma CVD) | +20 | No | Wrinkled |

As shown in Table 6, as a result of the observation of the state of the protective film, there was no particular change in the protective film of Experimental Example A. Wrinkles occurred in a very small area in Experimental Example B. The difference between Experimental Examples A and B is presumably because of a difference in internal stress of the protective films.

Wrinkles occurred in the protective film in Experimental Example C. Wrinkles occurred in Experimental Example C in a wider area than in Experimental Example B. This is presumably because of the effect obtained by the formation of the organic thin film.

Wrinkles occurred in the protective film in Experimental Example D. Wrinkles occurred in Experimental Example D in a wider area than in Experimental Example B. This is presumably because the organic thin film formed by wet coating prevented a chemical agent used in the color filter-forming step from penetrating the organic layer more than SiON deposited by plasma CVD.

As described above, the present invention can further suppress peeling of a protective film during the formation of color filters by providing an organic thin film on the protective film.

What is claimed is:

1. An imaging device comprising:
   a substrate;
   lower electrodes formed on the substrate;
   an organic layer formed on the lower electrodes and adapted to generate electric charges in response to irradiation with light;
   an upper electrode formed on the organic layer and adapted to transmit the light;
   a protective film formed on the upper electrode; and
   a patterned organic film formed on the protective film,
   wherein the protective film comprises at least one layer and has a total thickness of 30 to 500 nm,
   wherein the protective film of a single layer type has an internal stress of −50 MPa to +60 MPa in a whole of the protective film,
   wherein in the protective film of a two-layer type including a lower protective film and an upper protective film, the lower protective film has a thickness of 50 nm or less, and when the lower protective film is thinner than the upper protective film, the internal stress in the whole of the protective film satisfies an expression: $-4.6x-50 \leq y \leq -1.67x+60$ when x is in a range of $0 < x < 15$ and satisfies an expression: $-1.25x-100 \leq y < 0$ when x is in a range of $15 \leq x \leq 50$, where the thickness of the lower protective film is denoted by x (nm) and the internal stress in the whole of the protective film is denoted by y (MPa), and
   wherein, when the lower protective film is thicker than the upper protective film, the internal stress in the whole of the protective film is in a range of $0 < y \leq +115$ when x is in a range of $15 < x \leq 50$.

2. The imaging device according to claim 1, wherein the protective film comprises two layers.

3. The imaging device according to claim 1, wherein the protective film of the single layer type comprises a silicon oxynitride film.

4. The imaging device according to claim 1, wherein in the protective film of the two-layer type, the upper protective film comprises a silicon oxynitride film.

5. The imaging device according to claim 1, wherein the lower protective film comprises aluminum oxide.

6. The imaging device according to claim 1,
   wherein the light includes at least visible light,
   wherein the organic layer generates the electric charges in response to the radiation with the light including at least the visible light, and
   wherein the upper electrode comprises a conductive material which is transparent to the light including at least the visible light.

7. The imaging device according to claim 1, wherein the organic layer comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

8. The imaging device according to claim 1, wherein an organic thin film is formed between the protective film and the patterned organic film.

9. The imaging device according to claim 2,
   wherein the light includes at least visible light,
   wherein the organic layer generates the electric charges in response to the radiation with the light including at least the visible light, and
   wherein the upper electrode comprises a conductive material which is transparent to the light including at least the visible light.

10. The imaging device according to claim 2, wherein the organic layer comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

11. The imaging device according to claim 8, wherein the organic thin film has a thickness of 10 to 200 nm.

12. An imaging device comprising:
    a substrate;
    lower electrodes formed on the substrate;
    an organic layer formed on the lower electrodes and adapted to generate electric charges in response to irradiation with light;
    an upper electrode formed on the organic layer and adapted to transmit the light;
    a protective film formed on the upper electrode; and
    a patterned organic film formed on the protective film,
    wherein the protective film comprises two layers including a lower protective film and an upper protective film and has a total thickness of 30 to 500 nm,
    wherein the lower protective film has a thickness of at least 15 nm but 50 nm or less,
    wherein, when the lower protective film is thinner than the upper protective film, an internal stress in a whole of the protective film satisfies an expression: $-1.25x-100 \leq y < 0$, where the thickness of the lower protective film is denoted by x (nm) and the internal stress in the whole of the protective film is denoted by y (MPa), and
    wherein, when the lower protective film is thicker than the upper protective film, the internal stress in the whole of the protective film is in a range of $0 < y \leq +115$ when x is in a range of $15 < x \leq 50$.

13. The imaging device according to claim 12,
    wherein the light includes at least visible light,
    wherein the organic layer generates the electric charges in response to the radiation with the light including at least the visible light, and
    wherein the upper electrode comprises a conductive material which is transparent to the light including at least the visible light.

14. The imaging device according to claim 12, wherein the organic layer comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

15. An imaging device comprising:
    a substrate;
    lower electrodes formed on the substrate;
    an organic layer formed on the lower electrodes and adapted to generate electric charges in response to irradiation with light;
    an upper electrode formed on the organic layer and adapted to transmit the light;
    a protective film formed on the upper electrode;
    a patterned organic film formed on the protective film; and
    an organic thin film formed by coating between the protective film and the patterned organic film, wherein the protective film comprises at least one layer and has a total thickness of 30 to 500 nm.

16. The imaging device according to claim 15, wherein the light includes at least visible light, wherein the organic layer generates the electric charges in response to the irradiation with the light including at least the visible light, and wherein the upper electrode comprises a conductive material which is transparent to the light including at least the visible light.

17. The imaging device according to claim 15, wherein the organic layer comprises a photoelectric conversion layer formed on a side closer to the upper electrode and adapted to generate the electric charges in accordance with an amount of received light and an electron blocking layer formed on a side closer to the lower electrodes and adapted to suppress injection of electrons into the photoelectric conversion layer from the lower electrodes.

18. A method for manufacturing an imaging device comprising: a substrate; lower electrodes formed on the substrate; an organic layer formed on the lower electrodes and adapted to generate electric charges in response to irradiation with light; an upper electrode formed on the organic layer and adapted to transmit the light; a protective film formed on the upper electrode; and a patterned organic film formed on the protective film, the protective film comprising a lower protective film formed on the upper electrode and an upper protective film formed on the lower protective film, the method comprising:

a step of forming the lower protective film at a substrate temperature of 100° C. to 200° C. using an atomic layer deposition process; and a step of forming the upper protective film at a substrate temperature of 150° C. to 250° C. using a plasma CVD process.

* * * * *